(12) United States Patent
Van Cleemput et al.

(10) Patent No.: US 9,916,977 B2
(45) Date of Patent: Mar. 13, 2018

(54) LOW K DIELECTRIC DEPOSITION VIA UV DRIVEN PHOTOPOLYMERIZATION

(71) Applicant: Lam Research Corporation, Fremont, CA (US)

(72) Inventors: Patrick A. Van Cleemput, San Jose, CA (US); Nicholas Muga Ndiege, Fremont, CA (US); Jonathan D. Mohn, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/942,704

(22) Filed: Nov. 16, 2015

(65) Prior Publication Data

US 2017/0140931 A1    May 18, 2017

(51) Int. Cl.
| | |
|---|---|
| *H01L 21/469* | (2006.01) |
| *H01L 21/02* | (2006.01) |
| *H01L 21/3105* | (2006.01) |
| *H01L 21/687* | (2006.01) |
| *H01L 23/532* | (2006.01) |

(Continued)

(52) U.S. Cl.
CPC .... *H01L 21/02348* (2013.01); *H01L 21/0228* (2013.01); *H01L 21/02123* (2013.01); *H01L 21/02126* (2013.01); *H01L 21/02203* (2013.01); *H01L 21/02216* (2013.01); *H01L 21/02271* (2013.01); *H01L 21/02277* (2013.01); *H01L 21/02315* (2013.01); *H01L 21/3105* (2013.01); *H01L 21/68764* (2013.01); *H01L 21/68771* (2013.01); *C23C 16/00* (2013.01); *H01L 21/02115* (2013.01); *H01L 21/02274* (2013.01); *H01L 21/28562* (2013.01); *H01L 21/76844* (2013.01); *H01L 23/53238* (2013.01)

(58) Field of Classification Search
CPC .......... H01L 21/0234; H01L 21/02203; H01L 21/0228
USPC .......................................................... 438/760
See application file for complete search history.

(56) References Cited

U.S. PATENT DOCUMENTS

| 4,099,990 A | 7/1978 | Brown et al. |
| 4,740,480 A | 4/1988 | Ooka |

(Continued)

FOREIGN PATENT DOCUMENTS

| CN | 1655330 A | 8/2005 |
| CN | 1722403 A | 1/2006 |

(Continued)

OTHER PUBLICATIONS

U.S. Appl. No. 14/464,071, filed Aug. 20, 2014, entitled "Flowable Dielectric for Selective Ultra Low-K Pore Sealing."

(Continued)

*Primary Examiner* — Vu A Vu
(74) *Attorney, Agent, or Firm* — Weaver Austin Villeneuve & Sampson LLP

(57) ABSTRACT

Provided are methods and apparatus for ultraviolet (UV) assisted capillary condensation to form dielectric materials. In some embodiments, a UV driven reaction facilitates photo-polymerization of a liquid phase flowable material. Applications include high quality gap fill in high aspect ratio structures and por sealing of a porous solid dielectric film. According to various embodiments, single station and multi-station chambers configured for capillary condensation and UV exposure are provided.

17 Claims, 14 Drawing Sheets

(51) Int. Cl.
*H01L 21/285* (2006.01)
*C23C 16/00* (2006.01)
*H01L 21/768* (2006.01)

(56) References Cited

U.S. PATENT DOCUMENTS

| | | | |
|---|---|---|---|
| 4,923,720 A | 5/1990 | Lee et al. | |
| 5,281,274 A | 1/1994 | Yoder | |
| 5,320,983 A | 6/1994 | Ouellet | |
| 5,387,546 A | 2/1995 | Maeda et al. | |
| 5,462,603 A | 10/1995 | Murakami | |
| 5,516,721 A | 5/1996 | Galli et al. | |
| 5,525,157 A | 6/1996 | Hawkins et al. | |
| 5,534,731 A | 7/1996 | Cheung | |
| 5,558,717 A | 9/1996 | Zhao et al. | |
| 5,747,381 A | 5/1998 | Wu et al. | |
| 5,753,886 A | 5/1998 | Iwamura et al. | |
| 5,775,808 A | 7/1998 | Pan | |
| 5,796,074 A | 8/1998 | Edelstein et al. | |
| 5,807,785 A | 9/1998 | Ravi | |
| 5,840,631 A | 11/1998 | Kubo et al. | |
| 5,858,880 A | 1/1999 | Dobson et al. | |
| 5,874,367 A | 2/1999 | Dobson | |
| 5,879,574 A | 3/1999 | Sivaramakrishnan et al. | |
| 5,899,751 A | 5/1999 | Chang et al. | |
| 5,902,127 A | 5/1999 | Park | |
| 5,903,428 A | 5/1999 | Grimard et al. | |
| 5,911,833 A | 6/1999 | Denison et al. | |
| 5,932,289 A | 8/1999 | Dobson et al. | |
| 5,970,383 A | 10/1999 | Lee | |
| 5,990,013 A | 11/1999 | Berenguer et al. | |
| 6,013,581 A | 1/2000 | Wu et al. | |
| 6,035,101 A | 3/2000 | Sajoto et al. | |
| 6,054,379 A | 4/2000 | Yau et al. | |
| 6,060,384 A | 5/2000 | Chen et al. | |
| 6,072,227 A | 6/2000 | Yau et al. | |
| 6,114,224 A | 9/2000 | Ngo et al. | |
| 6,114,259 A | 9/2000 | Sukharev et al. | |
| 6,143,626 A | 11/2000 | Yabu et al. | |
| 6,207,535 B1 | 3/2001 | Lee et al. | |
| 6,218,268 B1 | 4/2001 | Xia et al. | |
| 6,242,366 B1 | 6/2001 | Beekman et al. | |
| 6,251,759 B1 | 6/2001 | Guo et al. | |
| 6,287,989 B1 | 9/2001 | Dobson | |
| 6,300,219 B1 | 10/2001 | Doan et al. | |
| 6,309,933 B1 | 10/2001 | Li et al. | |
| 6,323,123 B1 | 11/2001 | Liu et al. | |
| 6,383,951 B1 | 5/2002 | Li | |
| 6,399,213 B2 | 6/2002 | Shiokawa | |
| 6,413,583 B1 | 7/2002 | Moghadam et al. | |
| 6,439,244 B1 | 8/2002 | Wu | |
| 6,448,187 B2 | 9/2002 | Yau et al. | |
| 6,475,564 B1 | 11/2002 | Carter et al. | |
| 6,544,858 B1 | 4/2003 | Beekman et al. | |
| 6,605,955 B1 | 8/2003 | Costello et al. | |
| 6,613,695 B2 | 9/2003 | Pomarede et al. | |
| 6,635,586 B2 | 10/2003 | Goo et al. | |
| 6,640,840 B1 | 11/2003 | MacNeil | |
| 6,653,247 B2 | 11/2003 | MacNeil | |
| 6,660,663 B1 | 12/2003 | Cheung et al. | |
| 6,703,321 B2 * | 3/2004 | Geiger | H01L 21/02129 |
| | | | 257/E21.243 |
| 6,740,853 B1 | 5/2004 | Johnson et al. | |
| 6,743,436 B1 | 6/2004 | Lee | |
| 6,743,736 B2 | 6/2004 | Mardian et al. | |
| 6,787,463 B2 | 9/2004 | Mardian et al. | |
| 6,790,737 B2 | 9/2004 | Schneegans et al. | |
| 6,812,135 B2 | 11/2004 | Li et al. | |
| 6,828,162 B1 | 12/2004 | Halliyal et al. | |
| 6,846,757 B2 | 1/2005 | MacNeil | |
| 6,858,195 B2 | 2/2005 | Aronowitz et al. | |
| 6,902,947 B2 | 6/2005 | Chinn et al. | |
| 6,972,262 B2 | 12/2005 | Lee et al. | |
| 6,984,561 B2 | 1/2006 | Herner et al. | |
| 6,995,056 B2 | 2/2006 | Lee et al. | |
| 7,033,945 B2 | 4/2006 | Byun et al. | |
| 7,056,560 B2 | 6/2006 | Yim et al. | |
| 7,071,126 B2 | 7/2006 | Johnston et al. | |
| 7,074,690 B1 | 7/2006 | Gauri et al. | |
| 7,074,727 B2 | 7/2006 | Hsu et al. | |
| 7,084,505 B2 | 8/2006 | Hamada et al. | |
| 7,091,453 B2 | 8/2006 | Murayama et al. | |
| 7,153,783 B2 | 12/2006 | Lu et al. | |
| 7,211,525 B1 | 5/2007 | Shanker et al. | |
| 7,238,604 B2 | 7/2007 | Kloster et al. | |
| 7,271,112 B1 | 9/2007 | Papasouliotis et al. | |
| 7,311,782 B2 | 12/2007 | Strang et al. | |
| 7,365,000 B2 | 4/2008 | Lee et al. | |
| 7,480,129 B2 | 1/2009 | Brown et al. | |
| 7,498,273 B2 | 3/2009 | Mallick et al. | |
| 7,521,378 B2 | 4/2009 | Fucsko et al. | |
| 7,524,735 B1 * | 4/2009 | Gauri | C23C 16/045 |
| | | | 438/436 |
| 7,575,633 B2 | 8/2009 | Romanin | |
| 7,582,555 B1 | 9/2009 | Lang et al. | |
| 7,585,704 B2 | 9/2009 | Belyansky et al. | |
| 7,589,012 B1 | 9/2009 | Seo et al. | |
| 7,622,369 B1 | 11/2009 | Lee et al. | |
| 7,629,227 B1 | 12/2009 | Wang et al. | |
| 7,648,927 B2 | 1/2010 | Singh et al. | |
| 7,655,532 B1 | 2/2010 | Chen et al. | |
| 7,670,436 B2 | 3/2010 | Miller et al. | |
| 7,727,906 B1 | 6/2010 | Shanker et al. | |
| 7,794,544 B2 | 9/2010 | Nguyen et al. | |
| 7,804,130 B1 | 9/2010 | Fung | |
| 7,825,044 B2 | 11/2010 | Mallick et al. | |
| 7,888,233 B1 | 2/2011 | Gauri et al. | |
| 7,888,273 B1 | 2/2011 | Wang et al. | |
| 7,915,139 B1 | 3/2011 | Lang et al. | |
| 7,947,551 B1 | 5/2011 | Syue et al. | |
| 7,999,356 B2 | 8/2011 | Nakasaki et al. | |
| 8,178,159 B2 | 5/2012 | Baikerikar et al. | |
| 8,187,951 B1 | 5/2012 | Wang et al. | |
| 8,278,224 B1 | 10/2012 | Mui et al. | |
| 8,481,403 B1 | 7/2013 | Gauri et al. | |
| 8,557,712 B1 | 10/2013 | Antonelli et al. | |
| 8,580,697 B1 | 11/2013 | Lang et al. | |
| 8,664,287 B2 * | 3/2014 | Shukla | C08F 2/50 |
| | | | 520/1 |
| 8,685,867 B1 | 4/2014 | Danek et al. | |
| 8,728,958 B2 | 5/2014 | Ashtiani et al. | |
| 8,809,161 B2 | 8/2014 | Gauri et al. | |
| 8,846,536 B2 | 9/2014 | Draeger et al. | |
| 9,064,684 B1 | 6/2015 | Mui et al. | |
| 9,224,594 B2 | 12/2015 | Kashefi et al. | |
| 9,245,739 B2 | 1/2016 | Ndiege et al. | |
| 9,257,302 B1 | 2/2016 | Wang et al. | |
| 9,299,559 B2 | 3/2016 | Draeger et al. | |
| 2002/0006729 A1 | 1/2002 | Geiger et al. | |
| 2002/0007785 A1 | 1/2002 | Gujer et al. | |
| 2002/0050246 A1 | 5/2002 | Parkhe | |
| 2002/0076490 A1 | 6/2002 | Chiang et al. | |
| 2003/0040199 A1 | 2/2003 | Agarwal | |
| 2003/0066482 A1 | 4/2003 | Pokharna et al. | |
| 2003/0077887 A1 | 4/2003 | Jang et al. | |
| 2003/0124870 A1 | 7/2003 | Macneil et al. | |
| 2003/0146416 A1 | 8/2003 | Takei et al. | |
| 2003/0159655 A1 | 8/2003 | Lin et al. | |
| 2003/0194861 A1 | 10/2003 | Mardian et al. | |
| 2003/0207580 A1 | 11/2003 | Li et al. | |
| 2003/0210065 A1 | 11/2003 | Lu et al. | |
| 2004/0033639 A1 | 2/2004 | Chinn et al. | |
| 2004/0048455 A1 | 3/2004 | Karasawa et al. | |
| 2004/0152342 A1 | 8/2004 | Li et al. | |
| 2004/0169005 A1 | 9/2004 | Kim et al. | |
| 2004/0224496 A1 | 11/2004 | Cui et al. | |
| 2005/0020074 A1 | 1/2005 | Kloster et al. | |
| 2005/0026443 A1 | 2/2005 | Goo et al. | |
| 2005/0064698 A1 | 3/2005 | Chang et al. | |
| 2005/0112282 A1 | 5/2005 | Gordon | |
| 2005/0136684 A1 | 6/2005 | Mukai et al. | |
| 2005/0150453 A1 | 7/2005 | Simmons et al. | |
| 2005/0181566 A1 | 8/2005 | Machida et al. | |
| 2005/0191863 A1 | 9/2005 | Olmer et al. | |

(56) References Cited

U.S. PATENT DOCUMENTS

| | | |
|---|---|---|
| 2005/0212179 A1 | 9/2005 | Honda et al. |
| 2005/0229849 A1 | 10/2005 | Silvetti et al. |
| 2005/0258542 A1 | 11/2005 | Fuller et al. |
| 2005/0260864 A1 | 11/2005 | Huang et al. |
| 2006/0014384 A1 | 1/2006 | Lee et al. |
| 2006/0024912 A1 | 2/2006 | Lee |
| 2006/0172531 A1 | 8/2006 | Lin et al. |
| 2006/0183345 A1 | 8/2006 | Nguyen et al. |
| 2006/0216946 A1 | 9/2006 | Usami et al. |
| 2006/0223290 A1 | 10/2006 | Belyansky et al. |
| 2006/0269693 A1 | 11/2006 | Balseanu et al. |
| 2006/0270217 A1 | 11/2006 | Balseanu et al. |
| 2006/0279217 A1 | 12/2006 | Peuchert et al. |
| 2007/0054505 A1 | 3/2007 | Antonelli et al. |
| 2007/0256785 A1 | 11/2007 | Pamarthy et al. |
| 2007/0258186 A1 | 11/2007 | Matyushkin et al. |
| 2007/0277734 A1 | 12/2007 | Lubomirsky et al. |
| 2007/0281495 A1 | 12/2007 | Mallick et al. |
| 2007/0296035 A1 | 12/2007 | George et al. |
| 2007/0298585 A1 | 12/2007 | Lubomirsky et al. |
| 2008/0020591 A1 | 1/2008 | Balseanu et al. |
| 2008/0054466 A1 | 3/2008 | Nasu et al. |
| 2008/0066682 A1 | 3/2008 | Yamashita |
| 2008/0081434 A1 | 4/2008 | Nam et al. |
| 2008/0089001 A1 | 4/2008 | Parkhe et al. |
| 2008/0132087 A1 | 6/2008 | Xia et al. |
| 2008/0199977 A1 | 8/2008 | Weigel et al. |
| 2008/0274626 A1 | 11/2008 | Glowacki et al. |
| 2008/0318439 A1 | 12/2008 | Ito et al. |
| 2009/0020847 A1 | 1/2009 | Byun et al. |
| 2009/0053895 A1 | 2/2009 | Oshima et al. |
| 2009/0061647 A1 | 3/2009 | Mallick et al. |
| 2009/0104789 A1 | 4/2009 | Mallick et al. |
| 2009/0104790 A1 | 4/2009 | Liang |
| 2009/0159566 A1 | 6/2009 | Brillhart et al. |
| 2009/0159587 A1 | 6/2009 | Shimanuki et al. |
| 2009/0215282 A1 | 8/2009 | Moore et al. |
| 2009/0298257 A1 | 12/2009 | Lee et al. |
| 2009/0321936 A1 | 12/2009 | Kojima et al. |
| 2010/0000684 A1 | 1/2010 | Choi |
| 2010/0109155 A1 | 5/2010 | Liu et al. |
| 2010/0167533 A1 | 7/2010 | Lim et al. |
| 2011/0020955 A1 | 1/2011 | DeYoung |
| 2011/0081782 A1 | 4/2011 | Liang et al. |
| 2011/0151678 A1 | 6/2011 | Ashtiani et al. |
| 2012/0149213 A1 | 6/2012 | Nittala et al. |
| 2012/0161405 A1 | 6/2012 | Mohn et al. |
| 2012/0164328 A1 | 6/2012 | Kojima et al. |
| 2013/0122718 A1 | 5/2013 | Kato et al. |
| 2013/0230987 A1 | 9/2013 | Draeger et al. |
| 2014/0004717 A1* | 1/2014 | Chan .............. C23C 16/045 438/798 |
| 2014/0017904 A1 | 1/2014 | Gauri et al. |
| 2014/0150647 A1 | 6/2014 | Ahn et al. |
| 2014/0302689 A1 | 10/2014 | Ashtiani et al. |
| 2015/0004806 A1 | 1/2015 | Ndiege et al. |
| 2015/0044882 A1 | 2/2015 | Draeger et al. |
| 2015/0118862 A1 | 4/2015 | Reilly et al. |
| 2015/0118863 A1 | 4/2015 | Rathod et al. |
| 2016/0056071 A1 | 2/2016 | Draeger et al. |

FOREIGN PATENT DOCUMENTS

| | | |
|---|---|---|
| CN | 101079391 A | 11/2007 |
| EP | 1 063 692 A1 | 12/2000 |
| EP | 0 819 780 B1 | 2/2004 |
| JP | 2001-148382 | 5/2001 |
| JP | 2010-153859 | 7/2010 |
| KR | 10-2007-0104591 A | 10/2007 |
| TW | 380286 | 1/2000 |
| WO | WO 99/22043 A1 | 5/1999 |
| WO | WO 03/021642 | 3/2003 |
| WO | WO 2007/140376 | 12/2007 |
| WO | WO 2007/140424 | 12/2007 |
| WO | WO 2011/072143 | 6/2011 |

OTHER PUBLICATIONS

U.S. Appl. No. 14/942,703, filed Nov. 16, 2015, entitled "Apparatus for UV Flowable Dielectric."
U.S. Appl. No. 13/461,287, filed May 1, 2012, entitled "CVD Flowable Gap Fill".
U.S. Appl. No. 12/986,070, filed Jan. 6, 2011, entitled "Density Gradient-Free Gap Fill".
U.S. Office Action, dated Mar. 25, 2015, issued in U.S. Appl. No. 14/464,196.
U.S. Notice of Allowance, dated Sep. 14, 2015, issued in U.S. Appl. No. 14/464,196.
U.S. Office Action, dated Aug. 23, 2005, issued in U.S. Appl. No. 10/810,066.
U.S. Notice of Allowance and Fee Due, dated Feb. 15, 2006, issued in U.S. Appl. No. 10/810,066.
U.S. Office Action, dated Jun. 27, 2008, issued in U.S. Appl. No. 11/447,594.
U.S. Notice of Allowance and Fee Due, dated Dec. 11, 2008, issued in U.S. Appl. No. 11/447,594.
U.S. Office Action, dated May 24, 2010, issued in U.S. Appl. No. 12/411,243.
U.S. Final Office Action, dated Sep. 13, 2010, issued in U.S. Appl. No. 12/411,243.
U.S. Notice of Allowance, dated Oct. 6, 2010, issued in U.S. Appl. No. 12/411,243.
U.S. Office Action, dated May 18, 2012, issued in U.S. Appl. No. 12/984,524.
U.S. Final Office Action, dated Sep. 14, 2012, issued in U.S. Appl. No. 12/984,524.
U.S. Notice of Allowance, dated Mar. 7, 2013, issued in U.S. Appl. No. 12/984,524.
U.S. Office Action, dated Dec. 16, 2013, issued in U.S. Appl. No. 13/935,398.
U.S. Notice of Allowance, dated Apr. 11, 2014, issued in U.S. Appl. No. 13/935,398.
U.S. Office Action, dated Oct. 26, 2007, issued in U.S. Appl. No. 11/323,812.
U.S. Final Office Action, dated Apr. 9, 2008, issued in U.S. Appl. No. 11/323,812.
U.S. Office Action, dated Oct. 9, 2008, issued in U.S. Appl. No. 11/323,812.
U.S. Notice of Allowance and Fee Due, dated Apr. 23, 2009, issued in U.S. Appl. No. 11/323,812.
U.S. Notice of Allowance, dated Nov. 18, 2010, issued in U.S. Appl. No. 12/508,461.
U.S. Notice of Allowance, dated Aug. 6, 2012, issued in U.S. Appl. No. 13/031,077.
U.S. Notice of Allowance, dated Jul. 8, 2013, issued in U.S. Appl. No. 13/031,077.
U.S. Office Action, dated Nov. 4, 2008, issued in U.S. Appl. No. 11/925,514.
U.S. Final Office Action, dated Jun. 17, 2009, issued in U.S. Appl. No. 11/925,514.
U.S. Notice of Allowance, dated Jul. 29, 2009, issued in U.S. Appl. No. 11/925,514.
U.S. Office Action, dated Apr. 26, 2011, issued in U.S. Appl. No. 12/625,468.
U.S. Final Office Action, dated Oct. 14, 2011, issued in U.S. Appl. No. 12/625,468.
U.S. Notice of Allowance, dated Jan. 31, 2012, issued in U.S. Appl. No. 12/625,468.
U.S. Office Action, dated Aug. 15, 2013, issued in U.S. Appl. No. 13/461,287.
U.S. Office Action, dated Feb. 28, 2014, issued in U.S. Appl. No. 13/461,287.
U.S. Final Office Action, dated Aug. 26, 2014, issued in U.S. Appl. No. 13/461,287.

(56) References Cited

OTHER PUBLICATIONS

U.S. Notice of Allowance, dated Apr. 20, 2015, issued in U.S. Appl. No. 13/461,287.
U.S. Notice of Allowance, dated Sep. 10, 2015, issued in U.S. Appl. No. 13/461,287.
U.S. Notice of Allowance [Corrected Notice of Allowability], dated Oct. 22, 2015, issued in U.S. Appl. No. 13/461,287.
U.S. Office Action, dated Nov. 12, 2008, issued in U.S. Appl. No. 11/834,581.
U.S. Final Office Action, dated Aug. 6, 2009, issued in U.S. Appl. No. 11/834,581.
U.S. Office Action dated Dec. 18, 2009, issued in U.S. Appl. No. 11/834,581.
U.S. Final Office Action, dated Apr. 22, 2010, issued in U.S. Appl. No. 11/834,581.
U.S. Notice of Allowance, dated Oct. 7, 2010, issued in U.S. Appl. No. 11/834,581.
U.S. Office Action, dated Nov. 25, 2011, issued in U.S. Appl. No. 12/986,070.
U.S. Final Office Action, dated Jun. 25, 2012, issued in U.S. Appl. No. 12/986,070.
U.S. Office Action, dated Feb. 26, 2010, issued in U.S. Appl. No. 12/334,726.
U.S. Final Office Action, dated Oct. 26, 2010, issued in U.S. Appl. No. 12/334,726.
U.S. Office Action, dated Sep. 16, 2011, issued in U.S. Appl. No. 12/334,726.
U.S. Final Office Action, dated Mar. 30, 2012, issued in U.S. Appl. No. 12/334,726.
U.S. Final Office Action, dated Oct. 23, 2012, issued in U.S. Appl. No. 12/334,726.
U.S. Notice of Allowance dated Jun. 10, 2013, issued in U.S. Appl. No. 12/334,726.
U.S. Notice of Allowance, dated May 29, 2012, issued in U.S. Appl. No. 12/566,085.
U.S. Notice of Allowance, dated Jun. 21, 2012, issued in U.S. Appl. No. 12/566,085.
U.S. Office Action, dated Jun. 21, 2013, issued in U.S. Appl. No. 13/607,511.
U.S. Final Office Action, dated Dec. 11, 2013, issued in U.S. Appl. No. 13/607,511.
U.S. Office Action, dated Jul. 25, 2014, issued in U.S. Appl. No. 13/607,511.
U.S. Notice of Allowance, dated Jan. 23, 2015, issued in U.S. Appl. No. 13/607,511.
U.S. Office Action, dated Dec. 21, 2012, issued in U.S. Appl. No. 12/964,110.
U.S. Final Office Action, dated Sep. 12, 2013, issued in U.S. Appl. No. 12/694,110.
U.S. Notice of Allowance, dated Dec. 27, 2013, issued in U.S. Appl. No. 12/964,110.
U.S. Notice of Allowance, dated Apr. 23, 2014, issued in U.S. Appl. No. 12/964,110.
U.S. Office Action, dated Dec. 6, 2012, issued in U.S. Appl. No. 13/315,123.
U.S. Office Action, dated Jul. 15, 2013, issued in U.S. Appl. No. 13/315,123.
U.S. Notice of Allowance, dated Nov. 8, 2013, issued in U.S. Appl. No. 13/315,123.
U.S. Office Action, dated Nov. 8, 2013, issued in U.S. Appl. No. 13/313,735.
U.S. Final Office Action, dated Jul. 29, 2014, issued in U.S. Appl. No. 13/313,735.
U.S. Office Action, dated Oct. 10, 2014, issued in U.S. Appl. No. 13/313,735.
U.S. Office Action, dated Apr. 20, 2015, issued in U.S. Appl. No. 13/313,735.
U.S. Office Action, dated Oct. 22, 2015, issued in U.S. Appl. No. 13/313,735.
U.S. Office Action, dated Sep. 12, 2013, issued in U.S. Appl. No. 13/493,936.
U.S. Final Office Action, dated Feb. 3, 2014, issued in U.S. Appl. No. 13/493,936.
U.S. Notice of Allowance, dated May 22, 2014, issued in U.S. Appl. No. 13/493,936.
U.S. Office Action, dated Dec. 9, 2014, issued in U.S. Appl. No. 14/466,222.
U.S. Final Office Action, dated Jul. 14, 2015, issued in U.S. Appl. No. 14/466,222.
U.S. Notice of Allowance, dated Oct. 23, 2015, issued in U.S. Appl. No. 14/466,222.
Japanese Office Action dated Sep. 17, 2013 issued in JP2009-282737.
Japanese Office Action dated Jun. 3, 2014 issued in JP2009-282737.
PCT International Search Report and Written Opinion dated Aug. 10, 2011 issued in PCT/US2010/059721.
PCT International Preliminary Report on Patentability and Written Opinion dated Jun. 21, 2012 issued in PCT/US2010/059721.
Chinese First Office Action dated Feb. 8, 2014 issued in CN 2010-80055670.3.
Chinese Second Office Action dated Dec. 15, 2014 issued in CN 2010-80055670.3.
Chinese Third Office Action and Search Report dated Jun. 23, 2015 issued in CN 2010-80055670.3.
Taiwan Office Action [no translation] dated Jun. 12, 2015 issued in TW 099143081.
Chinese First Office Action and Search Report dated Dec. 18, 2014 issued in CN 201110424193.X.
Chinese Second Office Action and Search Report dated Sep. 14, 2015 issued in CN 201110424193.X.
Chinese First Office Action and Search Report dated Jan. 6, 2015 issued in CN 201110442926.2.
Chinese Second Office Action and Search Report dated Aug. 25, 2015 issued in CN 201110442926.2.
Bekiari, V. et al. (1998) "Characterization of Photoluminescence from a Material Made by Interaction of (3-Aminopropyl)triethoxysilane with Acetic Acid," *Langmuir*, 14(13):3459-3461.
Brankova et al. (2003) "Photoluminescence from Sol-Gel Organic/Inorganic Hybrid Gels Obtained through Carboxylic Acid Solvolysis," *Chem. Mater.*, 15(9):1855-1859.
Chung, Sung-Woong et al. (Mar. 2004) "Flowable Oxide CVD Process for Shallow Trench Isolation in Silicon Semiconductor," *Journal of Semiconductor Technology and Science*, 4(1):45-51.
Chung, Sung-Woong, et al. (2002) "Novel Shallow Trench Isolation Process Using Flowable Oxide CVD for sub-100nm DRAM," *IEEE, IEDM*, pp. 233-236.
Fessenden et al. (1961) "The Chemistry of Silicon-Nitrogen Compounds," *Chem. Rev.* 61(4)361-388.
Hatanaka, M., et al. (1991) "$H_2O$—TEOS Plasma-CVD Realizing Dielectrics Having a Smooth Surface," *IEEE*, VMIC Conference, pp. 435-441.
Kessler et al. (2006) "New insight in the role of modifying ligands in the sol-gel processing of metal alkoxide precursors: A possibility to approach new classes of materials," *J. Sol-Gel Sci. Techn.* 40(2-3):163-179.
Matsuura, M., et al. (1994) "Novel Self-Planarizing CVD Oxide for Interlayer Dielectric Applications," *IEEE*, pp. 117-120.
Nakano, M., et al. (1989) "Digital CVD of $SiO_2$," *Extended Abstracts of the 21st Conference on Solid State Devices and Materials*, Tokyo, pp. 49-52.
Noguchi, S. et al. (1987) "Liquid Phase Oxidation Employing O Atoms Produced by Microwave Discharge and $Si(CH_3)_4$," *Extended Abstracts of the 19th Conference on Solid State Devices and Materials*, Tokyo, pp. 451-454.
Sakaue, H., et al. (1990) "Digital Chemical Vapor Deposition of $SiO_2$ Using a Repetitive Reaction of Triethylsilane /Hydrogen and Oxidation," *Department of Electrical Engineering, Hiroshima University*, pp. L 124-L 127.
Stathatos et al. (Jul. 19, 2003) "Study of Acetic Acid-Catalyzed Nanocomposite Organic/Inorganic Ureasil Sol-Gel Ionic Conductors," *Langmuir*, 19:(18)7587-7591.

(56) References Cited

OTHER PUBLICATIONS

U.S. Office Action, dated Jan. 20, 2016, issued in U.S. Appl. No. 14/519,400.
U.S. Final Office Action, dated Jul. 29, 2016, issued in U.S. Appl. No. 14/519,400.
U.S. Office Action, dated Jan. 21, 2016, issued in U.S. Appl. No. 14/519,712.
U.S. Final Office Action, dated Jul. 29, 2016, issued in U.S. Appl. No. 14/519,712.
U.S. Office Action, dated Dec. 30, 2015, issued in U.S. Appl. No. 14/464,071.
U.S. Final Office Action, dated Sep. 2, 2016, issued in U.S. Appl. No. 14/464,071.
U.S. Notice of Allowance [Corrected Notice of Allowability], dated Jan. 11, 2016, issued in U.S. Appl. No. 13/461,287.
U.S. Office Action, dated Jun. 24, 2016, issued in U.S. Appl. No. 14/249,272.
U.S. Final Office Action, dated Feb. 19, 2016, issued in U.S. Appl. No. 13/313,735.
U.S. Office Action, dated Jul. 29, 2016, issued in U.S. Appl. No. 13/329,078.
Korean Office Action dated Dec. 27, 2015 issued in KR 10-2009-0124466.
Korean Office Action dated Jul. 12, 2016 issued in KR 10-2009-0124466.
Chinese Fourth Office Action dated Mar. 14, 2016 issued in CN 2010-80055670.3.
Taiwan Office Action dated Dec. 10, 2015 issued in TW 099143081.
Taiwan Office Action dated Apr. 20, 2016 issued in TW 100145389.
Taiwan Office Action dated Nov. 20, 2015 issued in TW 100147521.
Weast, (1975) "CRC Handbook of Chemistry and Physics," 56th edition, CRC Press, Cleveland, Ohio, excerpts from F-95 & F-119, 4 pages.

* cited by examiner

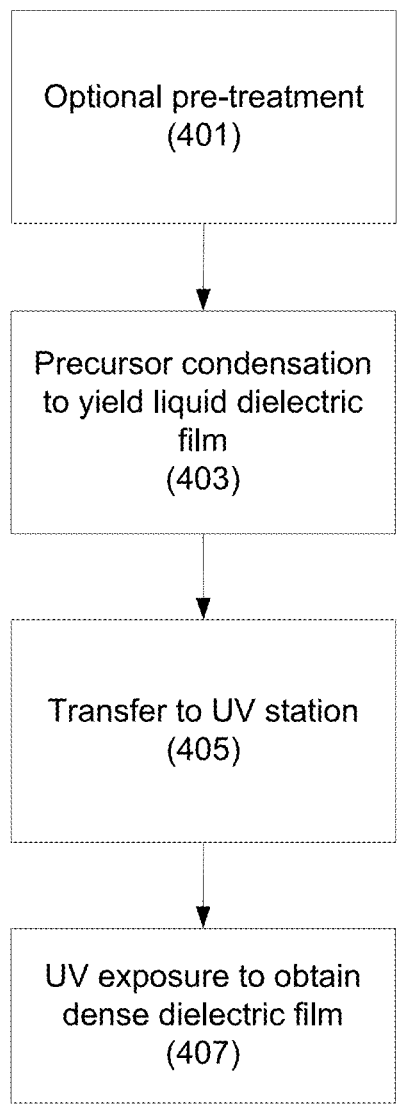
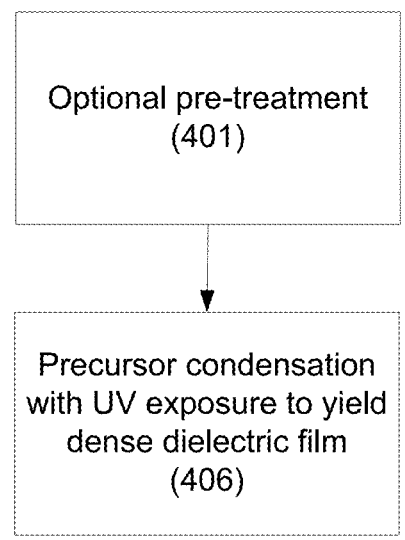
Figure 4B
Figure 4A

LOW K DIELECTRIC DEPOSITION VIA UV DRIVEN PHOTOPOLYMERIZATION

BACKGROUND

It is often necessary in semiconductor processing to fill high aspect ratio gaps with insulating material. This is the case for shallow trench isolation (STI), inter-metal dielectric (IMD) layers, inter-layer dielectric (ILD) layers, pre-metal dielectric (PMD) layers, passivation layers, etc. As device geometries shrink and thermal budgets are reduced, void-free filling of narrow width, high aspect ratio (AR) features (e.g., AR>6:1) becomes increasingly difficult due to limitations of existing deposition processes.

SUMMARY

One aspect of the disclosure may be implemented in a method for forming a dielectric film. The method includes introducing a vapor phase cyclical silicon precursor to a chamber housing a substrate; condensing the precursor or a reaction product thereof to form a flowable dielectric film on the substrate; and exposing the flowable dielectric film to ultraviolet radiation to polymerize the condensed precursor and form a solid dielectric film. A substrate temperature is maintained at a temperature less than the boiling point of the cyclical silicon precursor during the exposure.

In some embodiments, the condensation and polymerization is uncatalyzed. In some embodiments, the cyclical silicon precursor is a cyclic silazane or cyclic siloxane. Examples of cyclical silicon precursors include octamethylcyclotetrasiloxane, tetravinyltetramethylcyclotetrasiloxane, tetramethylcyclotetrasiloxane, pentamethylcyclopentasiloxane, and hexamethylcyclotrisiloxane. In some embodiments, the cyclical silicon precursor has a boiling point of at least 125° C. In some embodiments, the vapor cyclical precursor is introduced without a co-reactant.

In some embodiments, the flowable dielectric film is exposed to the ultraviolet radiation in the chamber. The flowable dielectric film may be exposed to the ultraviolet radiation in a same station of the chamber as the formation of the flowable dielectric film occurs. The method may further involve transferring the substrate to a different station in the chamber for ultraviolet exposure after condensing the precursor or a reaction product thereof on the substrate In some embodiments, the substrate is transferred to a different chamber for ultraviolet exposure after condensing the precursor or a reaction product thereof on the substrate. In some embodiments, the partial pressure of the dielectric precursor is below the saturation pressure of the dielectric precursor.

In some embodiments, the flowable dielectric films seal pores of a porous dielectric material on the substrate. In some embodiments, a solid dielectric film having no cracking and a thickness of greater than 1 micron is formed.

In some embodiments, the substrate temperature is maintained between about −20° C. and 100° C. In some embodiments, the polymerization proceeds by a radical-chain mechanism. In some embodiments, the polymerization involves photo dissociation of water.

These and other aspects of the disclosure are described further below.

BRIEF DESCRIPTION OF DRAWINGS

FIGS. 4A and 4B are flow diagrams illustrating examples processes for forming a flowable dielectric film.

DETAILED DESCRIPTION OF THE INVENTION

Introduction

Figure 1:
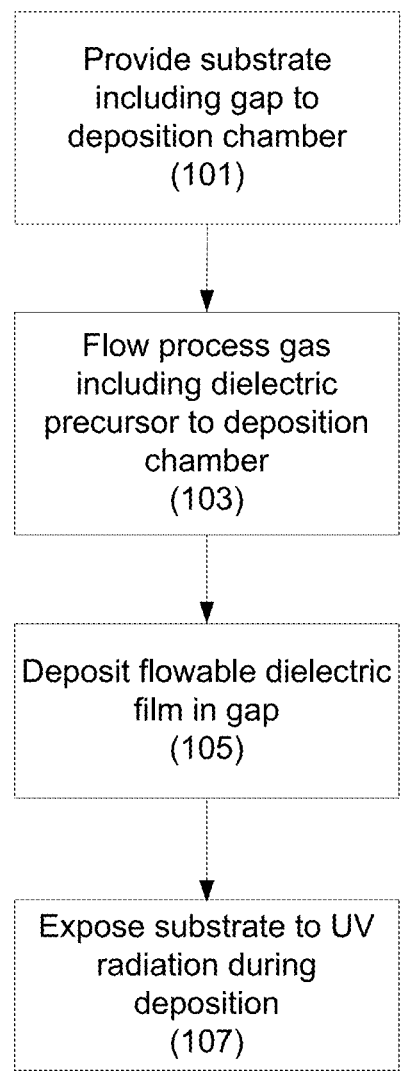
FIG. 1 is a flow diagram illustrating an example of a process for forming a flowable dielectric film.

Aspects of the present invention relate to forming flowable dielectric films on substrates and related apparatuses. Some embodiments include filling high aspect ratio gaps with insulating material. Some embodiments include filling small pores with insulating material. For ease of discussion, the description below refers chiefly to flowable silicon oxide films, however the processes described herein may also be used with other types of flowable dielectric films. For example, the dielectric film may be primarily silicon nitride, with Si—N and N—H bonds, primarily silicon oxynitrides, primarily silicon carbide, or primarily silicon oxycarbide films.

It is often necessary in semiconductor processing to fill high aspect ratio gaps with insulating material. This is the case for shallow trench isolation (STI), inter-metal dielectric (IMD) layers, inter-layer dielectric (ILD) layers, pre-metal dielectric (PMD) layers, passivation layers, etc. As device geometries shrink and thermal budgets are reduced, void-free filling of narrow width, high aspect ratio (AR) features becomes increasingly difficult due to limitations of existing deposition processes. In certain embodiments, the methods pertain to filling high aspect (AR) ratio (typically at least 6:1, for example 7:1 or higher), narrow width (e.g., sub-50 nm) gaps. In certain embodiments, the methods pertain to filling low AR gaps (e.g., wide trenches). Also in certain embodiments, gaps of varying AR may be on the substrate, with the embodiments directed at filling low and high AR gaps.

In a particular example, a PMD layer is provided between the device level and the first layer of metal in the interconnect level of a partially fabricated integrated circuit. The methods described herein include dielectric deposition in which gaps, (e.g., the gaps between gate conductor stacks) are filled with dielectric material. In another example, the methods are used for shallow trench isolation processes in which trenches are formed in semiconductor substrates to isolate devices. The methods described herein include dielectric deposition in these trenches. The methods can also be used for back end of line (BEOL) applications, in addition to front end of line (FEOL) applications. These can include filling gaps at an interconnect level.

Still further, in certain embodiments, the methods pertain to pore sealing of porous dielectric films using flowable dielectric material. For example, the methods can involve pore sealing of a porous ultra low-k (ULK) film in BEOL processing of semiconductor devices.

The methods described herein can be used for any type of flowable dielectric process including undoped silica glass (USG), low-k, and ultra-low k ULK flowable oxide.

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of the subject matter disclosed herein or possesses a structure of this subject matter disclosed herein.

Vapor-phase reactants are introduced to a deposition chamber to deposit the flowable dielectric films. As-deposited, the flowable dielectric films generally have flow characteristics that can provide consistent fill of at least the opening of a pore. The term "as-deposited flowable dielectric film" refers to a flowable dielectric film prior to any post-deposition treatments, densification, cure or anneal. An as-deposited flowable dielectric film may be characterized as a soft jelly-like film, a gel, a sol, or a flowable film. In some embodiments, the as-deposited film is a solid, non-liquid film that is liquid and flowable only during the deposition process; as soon as the deposition process stops, it is a solid film.

FIG. 1 is a process flow diagram illustrating one example of a process for forming a flowable dielectric film. The process can be used in the fabrication of semiconductor devices, displays, LEDs, photovoltaic panels and the like. As noted above, in semiconductor device fabrication, the process can be used for BEOL applications and FEOL applications. In some embodiments, the processes may be used for applications in which high aspect ratio gaps are filled with insulating material. Examples include shallow trench isolation (STI), formation of inter-metal dielectric (IMD) layers, inter-layer dielectric (ILD) layers, pre-metal dielectric (PMD) layers, and passivation layers, and filling gaps at the interconnect level. In some embodiments, the process can be used for pore-sealing. Further examples include formation of sacrificial layers for air gap formation or lift-off layers.

First, a substrate including a gap is provided to a deposition chamber (block 101). Examples of substrates include semiconductor substrates, such as silicon, silicon-on-insulator (SOI), gallium arsenide and the like, as well as glass and plastic substrates. The substrate includes at least one and typically more than one gap to be filled, with the one or more gaps being trenches, holes, vias, pores, or other unfilled features on the substrate.

Figure 2A:
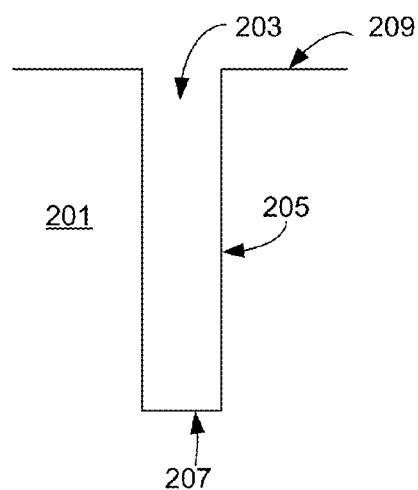
FIGS. 2A-2D show examples of schematic cross-sectional illustrations of substrates including gaps that may be filled with a flowable dielectric film.
Figure 2B:
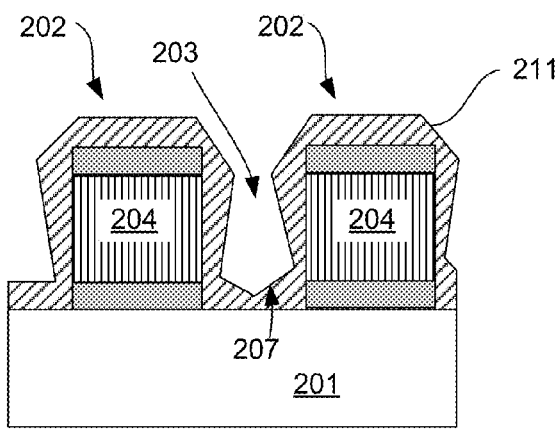

FIGS. 2A-2D show examples of schematic cross-sectional illustrations of substrates 201 including gaps 203. Turning first to FIG. 2A, a gap 203 can be defined by sidewalls 205 and a bottom 207. It may be formed by various techniques, depending on the particular integration process, including patterning and etching blanket (i.e., planar) layers on a substrate or by building structures having gaps therebetween on a substrate. In certain embodiments a top of the gap 203 can be defined as the level of planar surface 209. Specific examples of gaps are provided in FIGS. 2B and 2C. In FIG. 2B, a gap 203 is shown between two gate structures 202 on a substrate 201. The substrate 201 may be a semiconductor substrate and may contain n-doped and p-doped regions (not shown). The gate structures 202 include gates 204 and silicon nitride or silicon oxy-nitride layer 211. In certain embodiments, the gap 203 is re-entrant, i.e., the sidewalls taper inwardly as they extend up from the bottom 207 of the gap; gap 203 in FIG. 2B is an example of a re-entrant gap.

Figure 2C:
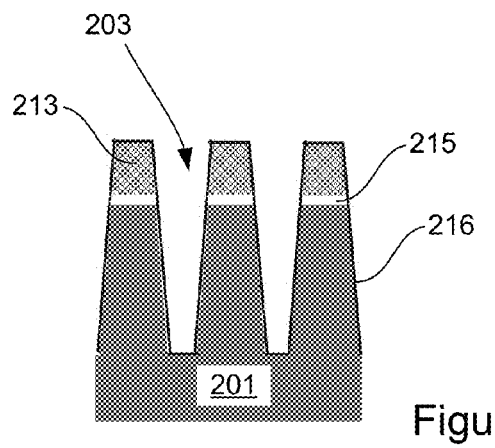

FIG. 2C shows another example of gap to be filled. In this example, gap 203 is a trench formed in silicon substrate 201. The sidewalls and bottom of the gap are defined by liner layer 216, e.g., a silicon nitride or silicon oxynitride layer. The structure also includes pad silicon oxide layer 215 and pad silicon nitride layer 213. FIG. 2C is an example of a gap that may be filled during a STI process. In certain cases, liner layer 216 is not present. In certain embodiments, the sidewalls of silicon substrate 201 are oxidized.

FIGS. 2B and 2C provide examples of gaps that may be filled with dielectric material in a semiconductor fabrication process. The processes described herein may be used to fill any gap that requires dielectric fill. In certain embodiments, the gap critical dimension is the order of about 1-50 nm, in some cases between about 2-30 nm or 4-20 nm, e.g. 13 nm. Critical dimension refers to the width of the gap opening at its narrowest point. In certain embodiments, the aspect ratio of the gap is between 3:1 and 60:1. According to various embodiments, the critical dimension of the gap is 32 nm or below and/or the aspect ratio is at least about 6:1.

As indicated above, a gap may be defined by a bottom surface and sidewalls. The term sidewall or sidewalls may be used interchangeably to refer to the sidewall or sidewalls of a gap of any shape, including a round hole, a long narrow trench, etc. In some embodiments, the processes described herein may be used to form flowable films on planar surfaces in addition to or instead of in gaps.

Figure 2D:
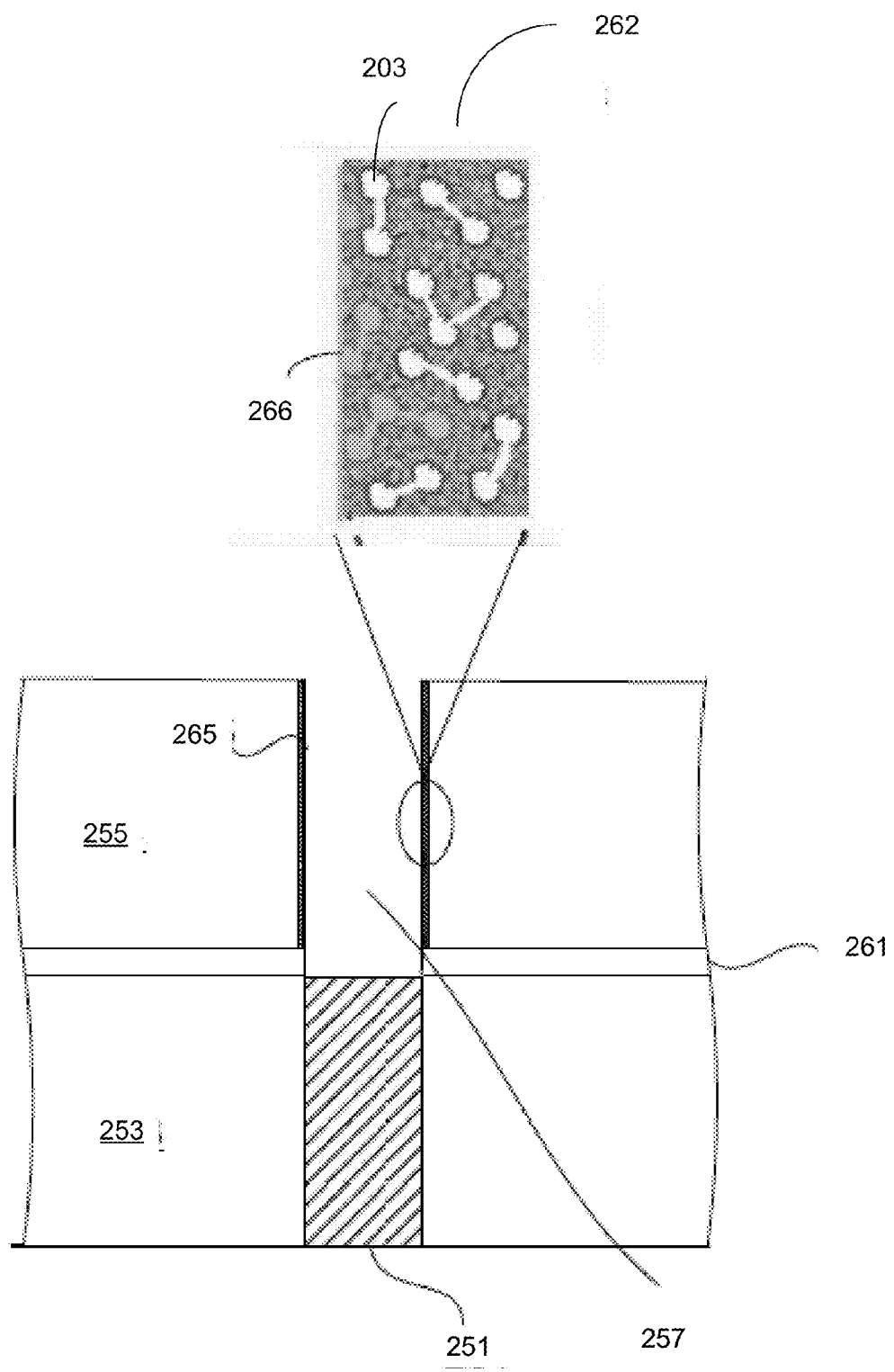

Also in some embodiments, the gap may be a pore. FIG. 2D shows an example of a structure including an embedded metal line 251 in a first dielectric layer 253. An etched porous dielectric layer 255 overlies the first dielectric layer 253 and, optionally an etch stop layer 261 such as a silicon carbide, silicon oxycarbide, silicon nitride, or silicon oxynitride etch stop layer. The etched porous dielectric layer 255 is etched in previous processing to define a recess 257 and expose the metal line 251. An exposed surface 262 of the etched porous dielectric layer 255 includes the surface of the recess 257.

The etched porous dielectric layer 255 is a porous dielectric having connected porosity. An enlarged schematic view of a cross-section of a portion of the etched porous dielectric layer 255 is depicted. The etched second dielectric layer includes gaps 203 that are connected (in or out of the plane of the cross-section) pores and thus exposed at the surface 212 to the ambient conditions.

A portion 265 of the etched porous dielectric layer 255 includes sealant material 266 deposited by a flowable dielectric deposition process. An enlarged schematic view of a cross-section of a portion of the sealed etched porous dielectric layer 255 is depicted. Gaps 203 that were previously open to the ambient are sealed with the sealant material 216 deposited from the flowable dielectric deposition process. Depending on whether or not the field regions of the etched porous dielectric layer 255 are capped or not with another material (e.g., such an etch stop or hard mask layer), pores open to the field region (not shown) may also be sealed in addition to the pores open to the recess 257. Subsequent operations may involve optionally cleaning or treating the surface of the metal line 251, depositing a barrier layer, and filling the recess 257 with a conductive material. If the pores are not sealed, any of these operations may result in precursor and/or metal penetration into the gaps 203, which can result in lower break down voltage and failure.

The porous dielectric film may be for example, a ULK film, having a dielectric constant of 2.4 or less. Examples of ULK films include carbon doped oxide (CDO) films, zeolite films, and polymer films.

The porosity of a dielectric film may be connected, and may include pores that are introduced by removal of a porogen from a dielectric matrix and/or pores that are inherent to the dielectric matrix. For example, a CDO matrix may have porosity due the incorporation of methyl or other organic groups. The porous dielectric film may include mesoporosity and/or microporosity. Mesoporosity generally refers to pore sizes of 2 nm-50 nm and microporosity to pore sizes less than 2 nm. In dielectrics having connected porosity, the size of at least some of the connected pores may be on a continuum with micropores having sizes on the order of Angstroms to nanometers, connected to mesopores having sizes on the order of nanometers to tens of nanometers. Although the methods may also be used to seal unconnected pores and provided smooth deposition surfaces, particular use may be found in sealing connected pores that left unsealed provide a diffusion pathway through a film. Porosity characteristics at the exposed surface may depend on the etch process as well as on the particular film and method of deposition.

Returning to FIG. 1, the deposition surface may be or include one or multiple materials. For example, sidewall and bottom surfaces that define a gap may be one material or include multiple materials. Referring to FIG. 2C, for example, if a liner layer 216 is present, it may be the only deposition surface. However, if the liner layer 216 is not present, the deposition surface can include the silicon substrate 201, the pad silicon oxide layer 215 and the pad silicon nitride layer 213. Examples of gap surface materials, including sidewall and/or bottom materials, include silicon nitrides, silicon oxides, silicon carbides, silicon oxynitrides, silicon oxycarbides, silicides, silicon germanium, as well as bare silicon or other semiconductor material. Particular examples include SiN, $SiO_2$, SiC, SiON, NiSi, and polysilicon. Further examples of gap materials used in BEOL processing include copper, tantalum, tantalum nitride, titanium, titanium nitride, ruthenium and cobalt. In certain embodiments, prior to flowable dielectric deposition, the gap is provided with a liner, barrier or other type of conformal layer formed in the gap, such that the deposition surfaces include the conformal layer. In some embodiments, the deposition surfaces of a substrate are exposed to a treatment. Examples of pre-deposition treatments are provided further below.

Returning to FIG. 1, a process gas including a dielectric precursor is flowed into the deposition chamber (block 103). As described below, the process gas may include an optional co-reactant. A flowable dielectric film is deposited into the gap (block 105).

In some embodiments, the flowable dielectric film is selectively deposited in the gap. Selective deposition refers to a process that preferentially deposits in a location without or prior to depositing in other locations. In block 105, the flowable dielectric material preferentially deposits inside the gaps rather than outside the gaps. In the context of pore sealing, the dielectric preferentially deposits in at least the opening of the pores of the porous dielectric material than outside the pores of the porous dielectric material, for example, on the discontinuous external surface of the porous dielectric and on the exposed metal surfaces in FIG. 2D. As such, deposition of flowable dielectric material on other exposed surfaces such as on the field regions may be non-existent or substantially non-existent, with one of ordinary skill in the art understanding that there may be some small areas of film nucleating on these surfaces.

According to various implementations, block 105 may involve a mechanism that deposits preferentially in the smallest features, be it a via hole, trench, or the small openings of pores in the porous dielectric, without or prior to forming a continuous film outside of these features.

In some implementations, block 105 exploits a thermodynamic effect in which a flowable dielectric material remains selectively condensed in the gaps, as the smallest spaces available for formation of the flowable dielectric material. As such the flowable dielectric material is selectively deposited in these gaps. In some pore sealing applications, the smallest space available is the openings to the pores such that flowable dielectric material is deposited in the openings but does not completely fill the pores. (In some implementations, the thermodynamic effect can be exploited to evaporate flowable dielectric material deposited outside the pores, while the flowable material in the pores remains condensed.)

Depositing a flowable oxide film, for example, can involve exposing the substrate to gaseous reactants including a dielectric precursor such that a condensed flowable film forms in the gap. The deposition generally occurs in non-plasma conditions, though in certain embodiments, plasma-enhanced conditions may be employed. In other embodiments, reactive species from a downstream plasma may be present even though the substrate is not directly exposed to a plasma.

The dielectric precursor is a silicon-containing compound. In some implementations, the dielectric precursor is a compound that undergoes photo-induced polymerization and may be a cyclic siloxane, a cyclic silazane, or a linear or cyclic silicon-containing compound that includes unsaturated hydrocarbon groups.

An oxidant such as a peroxide, ozone, oxygen, water, etc. may be optionally flowed. In some embodiments, the oxidant is a non-hydroxyl-forming oxidant such as ozone or oxygen.

In some implementations, a SiCOH film is formed, using for example a dielectric precursor including one or more Si—C bonds. In some implementations, the flowable dielectric film is a silicon and nitrogen-containing film, such as silicon nitride or silicon oxynitride deposited by introducing vapor phase reactants to a deposition chamber at conditions such that they react to form a flowable film. The nitrogen incorporated in the film may come from one or more sources, such as a silicon and nitrogen-containing precursor, a nitrogen precursor (for example, ammonia ($NH_3$) or hydrazine ($N_2H_4$)), or a nitrogen-containing gas (for example $N_2$, $NH_3$, NO, $NO_2$, or $N_2O$).

Further discussion of deposition chemistries is provided below.

The process gases may be introduced into the reactor simultaneously, or one or more component gases may be introduced prior to the others. U.S. Pat. No. 8,278,224, incorporated by reference herein, provides a description of reactant gas sequences that may be used in accordance with certain embodiments.

Block 105 may involve a capillary condensation mechanism in which the flowable dielectric material preferentially deposits in the smallest features. Due to capillary condensation, flowable process reactants can condense the smallest features even if their partial pressure is below the saturated vapor pressure. This is due to an increased number of van der Waals interactions between vapor phase molecules inside the confined space of capillaries (i.e., the gaps). In pore sealing applications, this allows pore sealing without continuous film deposition on surfaces and bottom up gap fill.

In some implementations, block 105 involves providing a precursor in a vapor phase at a partial pressure below its saturation pressure. The preference for liquid to remain condensed in the small spaces (i.e., capillary condensation) at pressures below the saturation pressure allows for selective deposition in gaps. In some embodiments, the partial pressure may be gradually increased until it approaches point the material begins to condense as a liquid in the gaps, or the precursor may be introduced at this pressure.

Reaction conditions are set to appropriately control the reactant partial pressures relative to their saturated vapor pressures, generally at relatively low temperatures, e.g., −20° C. to 100° C. The capillary condensation in the gaps may be self-limiting, stopping when the gaps are filled or when the pore or other gap openings are sealed.

Pressure and temperature may be varied to adjust deposition time; high pressure and low temperature are generally favorable for quick deposition. High temperature and low pressure will result in slower deposition time. Thus, increasing temperature may involve increasing pressure. In one embodiment, the temperature is about 5° C. and the pressure about 10 Torr. Exposure time depends on reaction conditions as well as pore or other gap size. Deposition rates are from about 100 angstroms/min to 1 micrometer/min according to various embodiments. The substrate is exposed to the reactants under these conditions for a period long enough to deposit a flowable film in the pores or other gaps. In certain embodiments, deposition time is 0.1-5 seconds.

Figure 3:
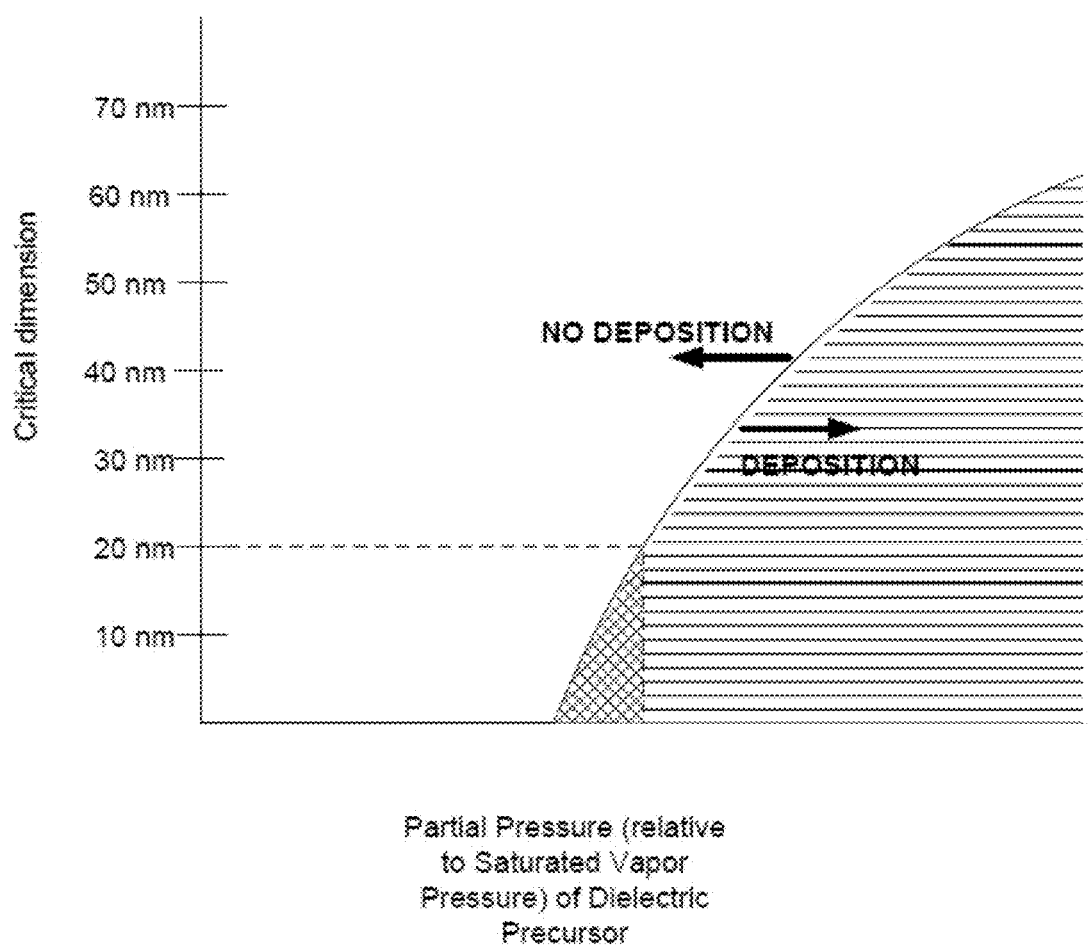
FIG. 3 is a schematic illustration of a graph showing an example of a critical dimension-partial pressure deposition curve.

The amount of condensation is controlled by the reactants' partial pressures relative to their saturated vapor pressures (which are constant for a given deposition temperature). The dependence of fill rate on critical dimension can be tuned by varying the partial pressures. In this manner, selectivity can be tuned, improving the capability to deposit in just the pores, other gaps, or as otherwise desired. This is illustrated qualitatively in FIG. 3, which shows a partial pressure-critical dimension deposition curve. At low enough partial pressure of the dielectric precursor, there is no condensation or deposition in features of any size. As the partial pressure is increased, the dielectric precursor condenses in small features, with deposition occurring in increasingly larger feature sizes as the partial pressure is increased. So, for example, to prevent deposition in a 20 nm etched trench of a ULK film while allowing deposition in the pores of the ULK film, the partial pressure of the dielectric precursor is maintained within the cross-hatched portion of the curve.

Returning to FIG. 1, at block 107, the substrate is exposed to UV radiation. As a result, photo-induced polymerization and densification occurs in some embodiments. According to various embodiments, UV exposure may be in-situ or ex-situ with respect to the deposition chamber. FIGS. 4A and 4B show operations in examples of in-situ and ex-situ processes. First, in FIG. 4A, an optional pre-treatment may be performed to activate the substrate and improve wettability (block 401). Examples of pre-treatments are given below. If performed, the pre-treatment may be in the same or a different station or chamber as the subsequent deposition. Next, a dielectric precursor is condensed to yield a liquid dielectric film (block 403). As discussed above, block 403 can involve capillary condensation to preferentially deposit in a pore or other gap. The substrate including the deposited dielectric film is then transferred to a UV station (block 405). The transfer may be under vacuum, for example, with the deposition chamber and UV station connected via a vacuum transfer chamber. The UV station may be in a single station or multi-station UV module. As described below, in some embodiments, the UV station may take place in the same module as the deposition, for example, with deposition taking place at one or more stations of a multi-station module and UV exposure taking place at one or more other stations of the multi-station module. UV exposure is then performed, yielding a dense solid dielectric film (block 407).

In some embodiments, blocks 403 to blocks 407 may be repeated to build up a film of a desired thickness. For example, UV exposure may be performed after each 500 nanometers of flowable dielectric film is deposited.

In various embodiments, dielectric precursors having relatively high boiling points are used such that the substrate can be maintained at a temperature below the boiling point during the process. This allows a dielectric precursor to be condensed and then transferred to the UV station. Temperature during UV exposure should also be kept significantly below the boiling point of the precursor or a condensed product thereof. In some embodiments, the substrate temperature during UV exposure may be at least 25° C. less than the boiling point of a precursor. Boiling points for examples of various precursors are given below.

In FIG. 4B, block 401 is performed as described above. Next, the dielectric precursor is condensed with simultaneous UV exposure to yield a dense solid dielectric film (block 406). UV exposure may be performed after dielectric deposition in-situ in the deposition chamber, in some embodiments.

The UV exposure in FIGS. 4A and 4B is distinct from a post-deposition UV cure operation that may be performed as an alternative to a thermal anneal, for example, to densify sol gel deposited films or remove reaction by products. Such UV cure operations typically take place at much higher temperatures.

Deposition Chemistries and Reaction Mechanisms

Dielectric Precursor

The dielectric precursor is a silicon-containing compound capable of undergoing photo-induced polymerization. Examples of such compounds include cyclic siloxanes, cyclic silazanes, and linear or cyclic silicon-containing precursors containing vinyl or other unsaturated hydrocarbon groups.

Examples of cyclic siloxanes include octamethylcyclotetrasiloxane (OMCTS), tetravinyltetramethylcyclotetrasiloxane (TVTMCTS), tetramethylcyclotetrasiloxane (TMCTS), pentamethylcyclopentasiloxane, and hexamethylcyclotrisiloxane. In some embodiments, cyclic siloxanes can be used in the methods described herein for catalyst-free deposition processes. In some embodiments, cyclic silazanes can be used in the methods described herein for catalyst-free deposition processes.

In some embodiments, dielectric precursors having relatively high boiling points are employed. For example, TMCTS has a boiling point of 135° C., TVTMCTS has a boiling point of 224° C., and OMCTS has a boiling point of 175° C. In some embodiments, dielectric precursors having boiling points of at least 100° C., at least 125° C., at least 150° C., at least 175° C., or at least 200° C. are employed. Boiling points are given at atmospheric pressure.

Figure 5:
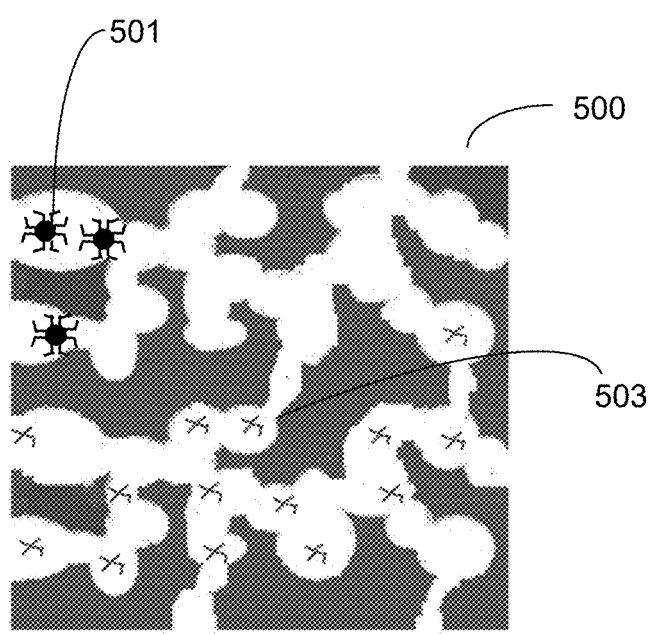
FIG. 5 is a schematic illustration of pore sealing according to certain implementations.

In pore-sealing applications, the size of the precursor may be tailored to the pore size of the porous dielectric film: it should be small enough that it fits in a pore, but large enough that it does not penetrate too deeply within the porous dielectric. This is illustrated in FIG. 5, in which relatively large cyclic molecules 501 (e.g., van der Waals radius of 1.2 nm) fit within the pores of the porous dielectric 500 to seal the pores, but do not penetrate deeply within the pores. By contrast, smaller linear molecules 503 (e.g., van der Waals radius of 0.5 nm) penetrate the porous dielectric, which can lead to an undesirable increase in dielectric constant. In some embodiments, the van der Waals radius of the molecule is targeted to be about the same as the average pore size. As an example, the average pore size of a CVD ULK film may be 1.0±0.5 nm. A cyclical molecule having a van der Waals radius of at least 0.8 nm may be used. In some embodiments, it may have a van der Waals radius of at least 1.0 nm or 1.2 nm.

According to various embodiments, the as-deposited film is a silicon oxide film or a silicon nitride film, including carbon-containing silicon oxide or silicon nitride films. According to various embodiments, Si—C or Si—N containing dielectric precursors may be used, either as a main dielectric precursor or a dopant precursor, to introduce carbon or nitrogen into the film. Examples of such films include carbon doped silicon oxides and silicon oxynitrides. In some embodiments, the silicon nitride film, including primarily Si—N bonds with N—H bonds.

Co-Reactant

For silicon oxide deposition, an oxidant may be employed in some embodiments. In some other embodiments, oxygen may be supplied solely by a cyclic siloxane precursor, for example, such that the deposition is a single reactant deposition, with no co-reactant. However, an oxidant may be supplied depending on the oxygen content of the particular precursor employed.

If employed, examples of suitable oxidants include, but are not limited to, ozone ($O_3$), peroxides including hydrogen peroxide ($H_2O_2$), oxygen ($O_2$), water ($H_2O$), alcohols such as methanol, ethanol, and isopropanol, nitric oxide (NO), nitrous dioxide ($NO_2$) nitrous oxide ($N_2O$), carbon monoxide (CO) and carbon dioxide ($CO_2$). In certain embodiments, a remote plasma generator may supply activated oxidant species.

For silicon nitride deposition, a nitrogen co-reactant may be employed in some embodiments. In some other embodiments, nitrogen may be supplied solely by a cyclic silazane precursor, for example, such that the deposition is a single reactant deposition, with no co-reactant. If employed, examples of suitable nitrogen co-reactants include, but are not limited to, ammonia ($NH_3$), hydrazine ($N_2H_4$), nitrogen ($N_2$), NO, $NO_2$, and $N_2O$.

Dopant

One or more dopant precursors, e.g., a carbon-, nitrogen-, fluorine-, phosphorous- and/or boron-containing gas, may be supplied. Sometimes, though not necessarily, an inert carrier gas is present. In certain embodiments, the gases are introduced using a liquid injection system. In certain embodiments, carbon-doped silicon precursors are used, either in addition to another precursor (e.g., as a dopant) or alone. Carbon-doped precursors can include at least one Si—C bond. In certain embodiments, aminosilane precursors are used.

Catalyst

In some embodiments, the deposition may be a catalyst-free deposition that does not employ any one of the below-described catalysts. However, a catalyst may be employed in certain embodiments. In certain embodiments, a proton donor catalyst is employed. Examples of proton donor catalysts include 1) acids including nitric, hydrofluoric, phosphoric, sulfuric, hydrochloric and bromic acids; 2) carboxylic acid derivatives including R—COOH and R—C(=O)X where R is substituted or unsubstituted alkyl, aryl, acetyl or phenol and X is a halide, as well as R—COOC—R carboxylic anhydrides; 3) $Si_xX_yH_z$ where x=1-2, y=1-3, z=1-3 and X is a halide; 4) $R_xSi$—$X_y$ where x=1-3 and y=1-3; R is alkyl, alkoxy, alkoxyalkane, aryl, acetyl or phenol; and X is a halide; and 5) ammonia and derivatives including ammonium hydroxide, hydrazine, hydroxylamine, and R—$NH_2$ where R is substituted or unsubstituted alkyl, aryl, acetyl, or phenol.

In addition to the examples of catalysts given above, halogen-containing compounds which may be used include halogenated molecules, including halogenated organic molecules, such as dichlorosilane ($SiCl_2H_2$), trichlorosilane ($SiCl_3H$), methylchlorosilane ($SiCH_3ClH_2$), chlorotriethoxysilane, chlorotrimethoxysilane, chloromethyldiethoxysilane, chloromethyldimethoxysilane, vinyltrichlorosilane, diethoxydichlorosilane, and hexachlorodisiloxane. Acids which may be used may be mineral acids such as hydrochloric acid (HCl), sulfuric acid ($H_2SO_4$), and phosphoric acid ($H_3PO_4$); organic acids such as formic acid (HCOOH), acetic acid ($CH_3COOH$), and trifluoroacetic acid ($CF_3COOH$). Bases which may be used include ammonia ($NH_3$) or ammonium hydroxide ($NH_4OH$), phosphine ($PH_3$); and other nitrogen- or phosphorus-containing organic compounds. Additional examples of catalysts are chlorodiethoxysilane, methanesulfonic acid ($CH_3SO_3H$), trifluoromethanesulfonic acid ("triflic", $CF_3SO_3H$), chloro-dimethoxysilane, pyridine, acetyl chloride, chloroacetic acid ($CH_2ClCO_2H$), dichloroacetic acid ($CHCl_2CO_2H$), trichloroacetic acid ($CCl_2CO_2H$), oxalic acid ($HO_2CCO_2H$), benzoic acid ($C_6H_5CO_2H$), and triethylamine.

Examples of other catalysts include hydrochloric acid (HCl), hydrofluoric acid (HF), acetic acid, trifluoroacetic acid, formic acid, dichlorosilane, trichlorosilane, methyltrichlorosilane, ethyltrichlorosilane, trimethoxychlorosilane, and triethoxychlorosilane.

In addition to the catalysts described above, in some implementations, catalysts formulated for BEOL processing applications may be used. Such catalysts are disclosed in U.S. patent application Ser. No. 14/464,196 titled "LOW-K OXIDE DEPOSITION BY HYDROLYSIS AND CONDENSATION", Aug. 20, 2014 and incorporated herein by reference.

In some implementations, halogen-free acid catalysts may be employed, with examples including 1) acids including nitric, phosphoric, sulfuric acids; and 2) carboxylic acid derivatives including R—COOH where R is substituted or unsubstituted alkyl, aryl, acetyl or phenol, as well as R—COOC—R carboxylic anhydrides.

Also in some implementations, self-catalyzing silane dielectric precursors including aminosilanes, may be used. Aminosilanes that may be used include, but are not limited to, the following: (1) $H_x$—Si—$(NR)_y$ where x=0-3, x+y=4 and R is an organic hydride group. Further examples of self-catalyzed dielectric precursors are provided in U.S. patent application Ser. No. 14/464,196, incorporated herein by reference.

Surfactants

Surfactants may be used to relieve surface tension and increase wetting of reactants on the substrate surface. They may also increase the miscibility of the dielectric precursor with the other reactants, especially when condensed in the liquid phase. Examples of surfactants include solvents, alcohols, ethylene glycol and polyethylene glycol. Difference surfactants may be used for carbon-doped silicon precursors because the carbon-containing moiety often makes the precursor more hydrophobic.

Solvents may be non-polar or polar and protic or aprotic. The solvent may be matched to the choice of dielectric precursor to improve the miscibility in the oxidant. Non-polar solvents include alkanes and alkenes; polar aprotic solvents include acetones and acetates; and polar protic solvents include alcohols and carboxylic compounds.

Examples of solvents that may be introduced include alcohols, e.g., isopropyl alcohol, ethanol and methanol, or other compounds, such as ethers, carbonyls, nitriles, miscible with the reactants. Solvents are optional and in certain embodiments may be introduced separately or with the oxidant or another process gas. Examples of solvents include, but not limited to, methanol, ethanol, isopropanol, acetone, diethylether, acetonitrile, dimethylformamide, and dimethyl sulfoxide, tetrahydrofuran (THF), dichloromethane, hexane, benzene, toluene, isoheptane and diethylether. The solvent may be introduced prior to the other reactants in certain embodiments, either by puffing or normal delivery. In some embodiments, the solvent may be introduced by puffing it into the reactor to promote hydrolysis, especially in cases where the precursor and the oxidant have low miscibility.

Carrier Gases

Sometimes, though not necessarily, an inert carrier gas is present. For example, helium and/or argon, may be introduced into the chamber with one of the compounds described above.

Any of the process gases (silicon-containing precursor, oxidant or other co-reactant, solvent, catalyst, etc.) either alone or in combination with one or more other reactants, may be introduced prior to the remaining reactants. Also in certain embodiments, one or more reactants may continue to flow into the reaction chamber after the remaining reactant flows have been shut off.

Reaction Mechanisms

It has been found that when using certain dielectric precursors, excellent fill may be achieved using the processes described with reference to FIGS. 4A and 4B, even in the absence of a catalyst. In particular, cyclic siloxanes have been found to provide excellent fill even in the absence of a catalyst. It is believed that cyclic silazanes would show similar results.

Without being bound by a particular theory, it is believed that a reaction may transpire by one or more of the following reaction mechanisms.

In some embodiments, the reaction may proceed by a radical-chain mechanism. The radical initiation mechanism is possibly (but not limited to) an adsorbate based radical which adds across oxidizable neighbors such as unsaturated hydrocarbon bonds (such as terminal vinyl, hydrides, or halides) on a siloxane ring that constitute the condensed precursor. Radical propagation progresses to generate a polymer film out of the condensed liquid and release H radicals that recombine to release $H_2$ gas or terminal hydride on reactor surfaces. The final product is a dense low-k oxide film devoid of unsaturated hydrocarbons.

In some embodiments, ring opening and polymerization may include photo dissociation of small amounts of water:

$$H_2O + UV(\text{wavelength less than } 242.5) \rightarrow H^+ + OH^-$$

Figure 6:
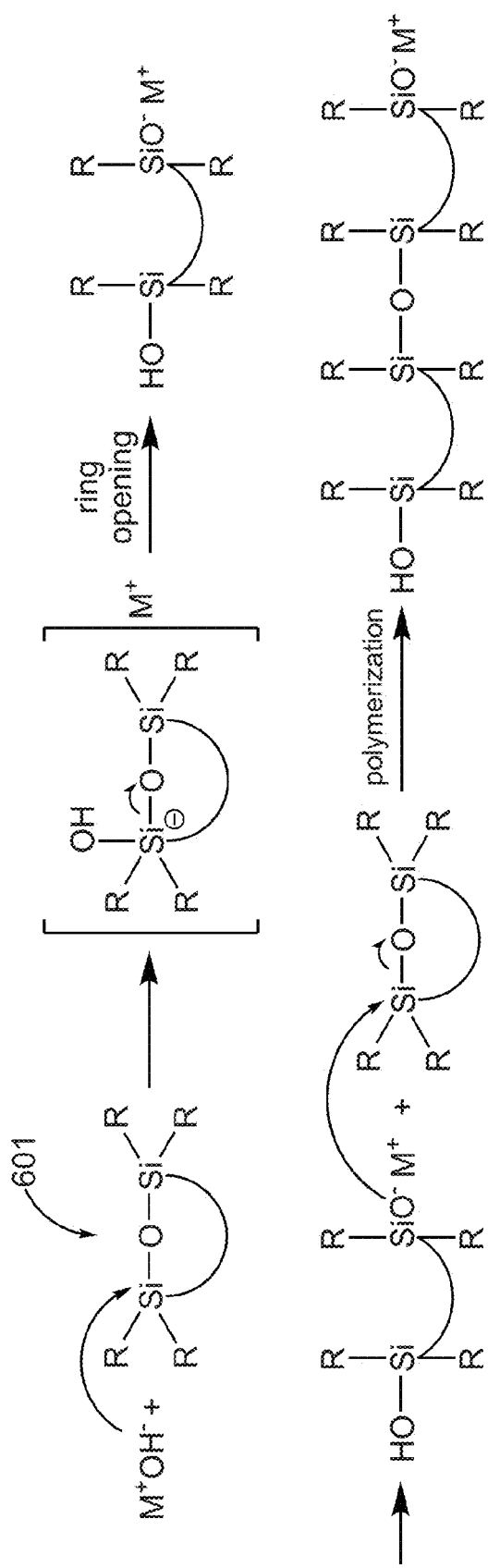
FIG. 6 is an example of a reaction mechanism that may be employed in certain implementations.

The ring opening and polymerization reactions may proceed as shown in the example of FIG. 6 for a generic cyclic siloxane ring 601. (R represents organic groups and M represents any positively charged moiety (e.g., $H^+$ or $NH_4^+$) in the mechanism shown in FIG. 6). A hydroxyl anion generated by the photodissociation attacks a silicon atom of the siloxane ring, which results in the ring opening. Polymerization may then proceed by a $SiO^-$ attack on another siloxane ring, resulting in opening that ring and polymerizing.

The above-described mechanisms are distinct from sol gel deposition reactions where a precursor and an oxidizer are introduced and condensed onto a substrate where they are allowed to react via hydrolysis and polycondensation to form an oxide film with water and alcohol as byproducts. Advantages to certain described embodiments include reduced or eliminated reliance on post deposition film processing such as thermal or UV cure for film densification and removal of reaction byproducts, excess reactants and adsorbed residual hydroxyl groups to attain the desired physical and electrical properties. As noted above, in some embodiments, the described methods allow flowable dielectric deposition without a catalyst and with a halide-free chemistry. By contrast, hydrolysis and polycondensation depositions typically include use of catalysts that could oxidize metallic components of integrated structures. Halide anions that constitute the catalyst also may be retained in the deposited material and leach out of the low-k layer into other parts of the integrated structure leading to corrosion during integration/further processing/longer times. Residual halide anions can also lead to mobile charges in the dielectric layer, degrading its insulating electrical properties. While organic acid catalysts may address some issues associated with halide catalysts, their use is limited by relatively lower deposition rates and a need for long queue times. Moreover, photosensitivity of uncured films derived from organic acid catalyzed deposition also poses significant post deposition processing challenges. Basic catalysts that are molecularly grafted as part of the precursor or incorporated as an additive result in significantly porous films. Embodiments of the methods described herein can avoid these issues associated with halide, organic acid and base catalysts.

There is typically a presence of pores and voids within material deposited in small dimensions via hydrolsysis-polycondensation deposition. These pores and voids are generated upon removal of byproducts and unreacted material. Embodiments of the methods that do not rely on hydrolysis and polycondensation may not have these voids. The generated by products generated are H radicals and $H_2$ gas, which are easily expunged without leaving voids and pores behind. In particular, single reactant systems (no co-reactant) generate significantly fewer byproducts with no unreacted material left behind at the end of deposition.

According to various embodiments, the films may be deposited at thicknesses of several microns, while still maintaining excellent quality. By contrast, sol gel derived films typically exhibit low hardness and modulus and with tensile stresses that limit maximum thicknesses to about 1 micron before film begins to crack. By contrast, the methods herein may be used to deposit films up to 2 microns before cracking has been observed.

A radical chain reaction mechanism also has a significantly more rapid rate of deposition that a hydrolysis-polycondensation reaction.

Reaction Conditions

Reactions conditions can be such that the dielectric precursor, or a vapor phase product of a reaction thereof, condenses on the substrate surface to form a flowable film. Chamber pressure may be between about 1 and 200 Torr, in certain embodiments, it is between 10 and 75 Torr. In a particular embodiment, chamber pressure is about 10 Torr.

Substrate temperature is between about −20° C. and 100° C. in certain embodiments. In certain embodiments, temperature is between about −20° C. and 30° C., e.g., between −10° C. and 10° C. Pressure and temperature may be varied to adjust deposition time; high pressure and low temperature are generally favorable for quick deposition. High temperature and low pressure will result in slower deposition time. Thus, increasing temperature may involve increasing pressure. In one embodiment, the temperature is about 5° C. and the pressure about 10 Torr. Exposure time depends on reaction conditions as well as pore or other gap size. Deposition rates are from about 100 angstroms/min to 1 micrometer/min according to various embodiments. The substrate is exposed to the reactants under these conditions for a period long enough to deposit a flowable film in the pores or other gaps. In certain embodiments, deposition time is 0.1-5 seconds.

As described above, the amount of condensation may be controlled by the reactants' partial pressures relative to their saturated vapor pressures (which are constant for a given deposition temperature).

Substrate temperature throughout the deposition and simultaneous or subsequent UV exposure is maintained at a level below the boiling point of the dielectric precursors and reaction products thereof. Pressure throughout the deposition and simultaneous or subsequent UV exposure may be sub-atmospheric.

Example UV intensities include 50 W to 500 W of 253.7 nm UV from a broadband (190 nm to 290 nm) source.

Pre-Treatment

According to various embodiments, a pretreatment operation involves exposure to a plasma containing oxygen, nitrogen, helium or some combination of these. The plasma may be downstream or in-situ, generated by a remote plasma generator, such as an Astron® remote plasma source, an inductively-coupled plasma generator or a capacitively-coupled plasma generator. Examples of pre-treatment gases include $O_2$, $O_3$, $H_2O$, NO, $NO_2$, $N_2O$, $H_2$, $N_2$, He, Ar, and combinations thereof, either alone or in combination with other compounds. Examples of chemistries include $O_2$, $O_2/N_2$, $O_2/He$, $O_2/Ar$, $O_2/H_2$ and H2/He. The particular process conditions may vary depending on the implementation. In alternate embodiments, the pretreatment operation involves exposing the substrate to $O_2$, $O_2/N_2$, $O_2/He$, $O_2/Ar$ or other pretreatment chemistries, in a non-plasma environment. The particular process conditions may vary depending on the implementation. In these embodiments, the substrate may be exposed to the pretreatment chemistry in the presence energy from another energy source, including a thermal energy source, a ultra-violet source, a microwave source, etc. In certain embodiments, in addition to or instead of the pretreatment operations described above, a substrate is pretreated with exposure to a catalyst, surfactant, or adhesion-promoting chemical. The pre-treatment operation, if performed, may occur in the deposition chamber or may occur in another chamber prior to transfer of the substrate to the deposition chamber. Once in the deposition chamber, and after the optional pre-treatment operation, process gases are introduced.

Surface treatments to create hydrophilic surfaces that can be wet and nucleate evenly during deposition are described in U.S. patent application Ser. No. 14/519,400, titled "Treatment For Flowable Dielectric Deposition On Substrate Surfaces," incorporated by reference herein. As described therein, the surface treatments may involve exposure to a remote plasma.

EXPERIMENTAL

Figure 7:
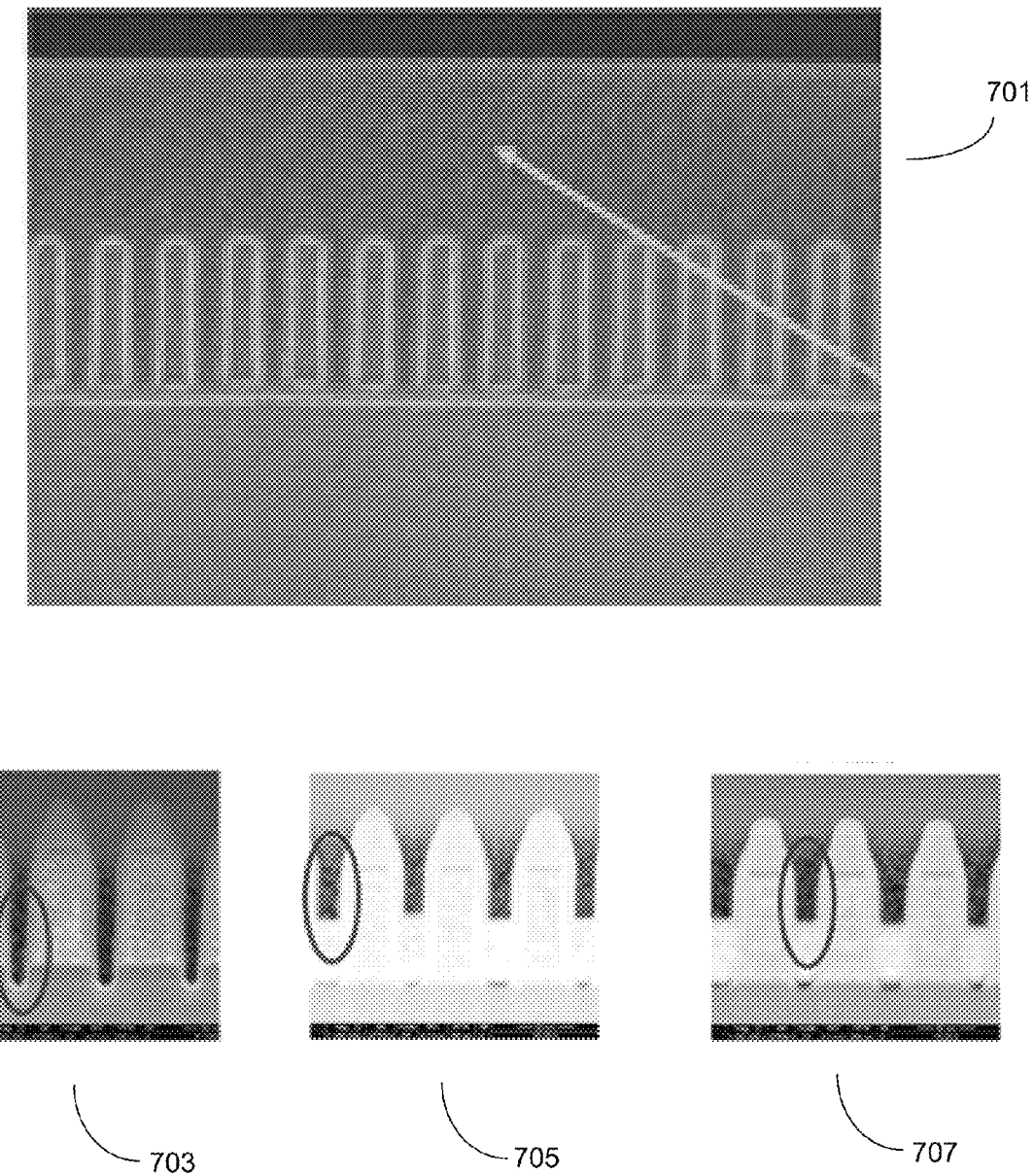
FIG. 7 shows an image 701 of uniform densified flowable film formed with in-situ UV exposure.

FIG. 7 shows an image 701 of uniform densified flowable film formed with in-situ UV exposure as described with reference to FIG. 4B. TVTMCTS was the dielectric precursor, with no oxidant employed. Chamber pressure was 25 Torr and substrate temperature was 25° C. A 12 KW UV source at 35% power (4.2 KW) was used to irradiate the chamber interior during deposition. Notably the film is of uniform density (indicated by the uniform shade of the fill in the image) and there is no line bending observed. This indicates that the flowability of the film is maintained without line bending. The results shown in image 701 are substantially better than those deposited using triethoxysilane (TES) as shown in images 703, 705 and 707, regardless of the cure. The flowable oxide in image 703 was exposed to a UV Cure at 250° C.; the flowable oxide in image 705 was exposed to a thermal cure at 545° C. for 10 minutes, and the flowable oxide in image 707 was exposed to a thermal cure at 545° C. for 10 minutes followed by a UV cure. In each case, there is a density gradient (visible by the graded, non-uniform shade in the images) indicated in the circled portion.

Figure 8:
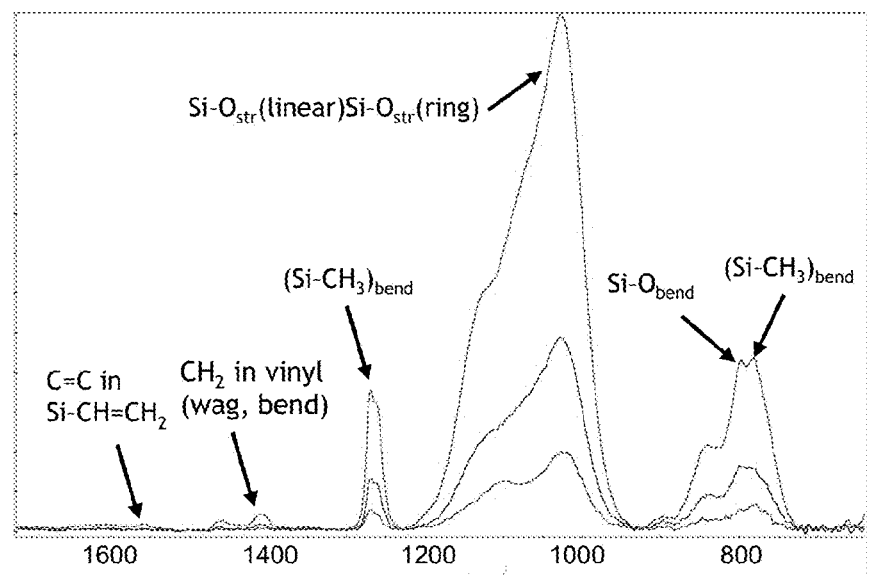
FIG. 8 shows Fourier transform infrared spectroscopy (FTIR) spectra for films deposited from TVTMCTS with no oxidant employed and in-situ UV exposure during the deposition
Figure 8:
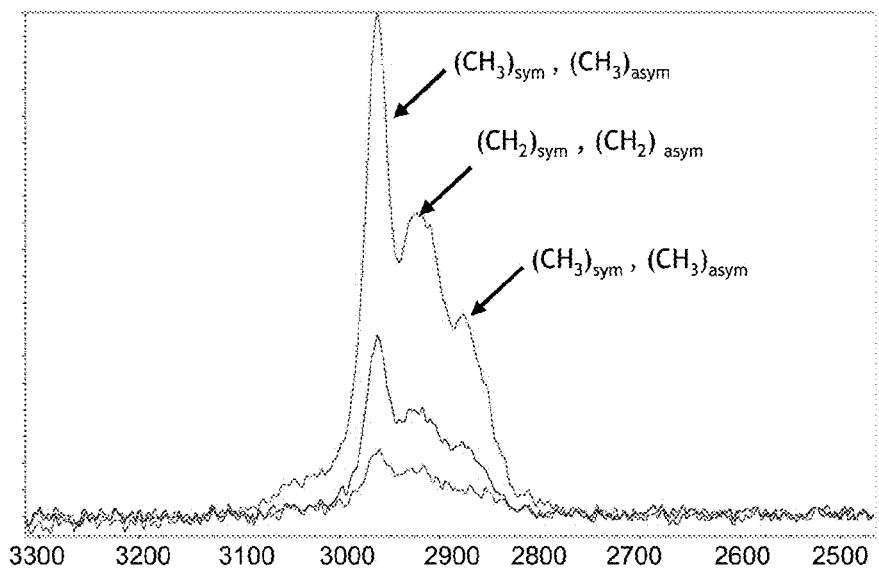

FIG. 8 shows Fourier transform infrared spectroscopy (FTIR) spectra for films deposited from TVTMCTS with no oxidant employed and in-situ UV exposure during the deposition. The spectra show that the deposited films retain Si—$CH_3$ groups. Cage and network oxide phases are observed. Residual vinyl groups are observed in thicker films.

Apparatus

The methods of the present invention may be performed on a wide-range of modules. The methods may be implemented on any apparatus equipped for deposition of dielectric film, including HDP-CVD reactors, PECVD reactors, sub-atmospheric CVD reactors, any chamber equipped for CVD reactions, and chambers used for PDL (pulsed deposition layers).

Such an apparatus may take many different forms. Generally, the apparatus will include one or more modules, with each module including a chamber or reactor (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). While in process, each wafer is held in place by a pedestal, wafer chuck and/or other wafer holding apparatus. For certain operations in which the wafer is to be heated, the apparatus may include a heater such as a heating plate. Examples of suitable reactors are the Sequel™ reactor, the Vector™, the Speed™ reactor, and the Gamma™ reactor all available from Lam Research of Fremont, Calif.

Figure 9:
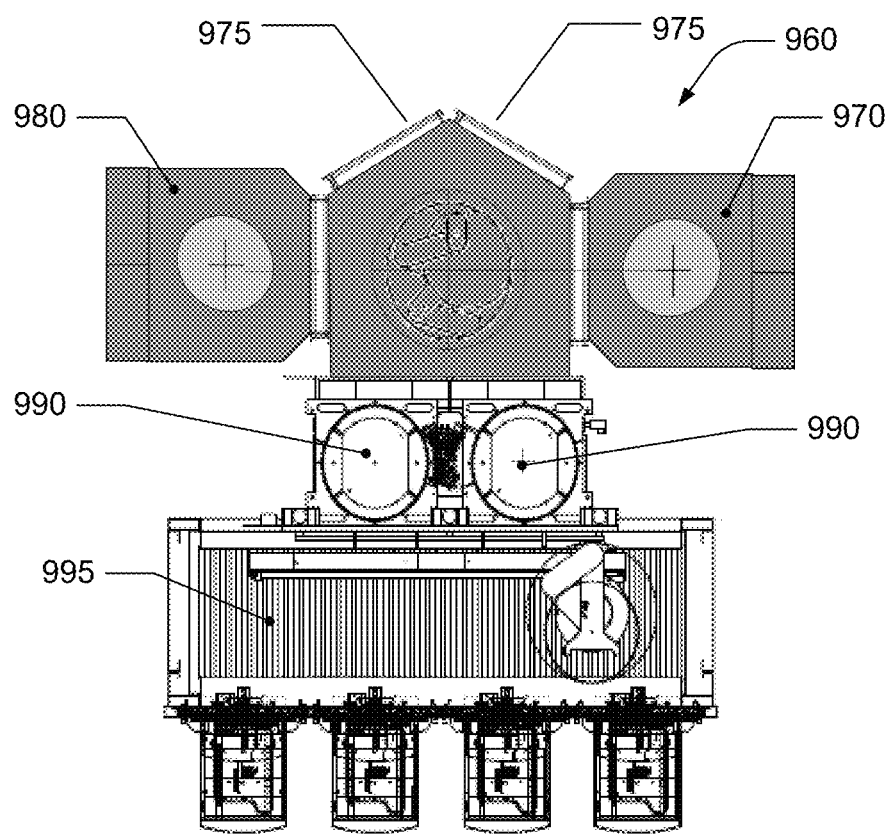
FIGS. 9, 10, 11A, 11B, 12A, and 12B are schematic illustrations of apparatus suitable to practice the methods described herein.

As discussed above, according to various embodiments, the surface treatment may take place in the same or different module as the flowable dielectric deposition. FIG. 9 shows an example tool configuration 960 including wafer transfer system 995 and loadlocks 990, flowable deposition module 970, and UV module 980. Additional modules, such as a pre-deposition treatment module, and/or one or more additional deposition modules 970 or UV modules 980 may also be included at 975.

Modules that may be used for pre-treatment include SPEED or SPEED Max, NOVA Reactive Preclean Module (RPM), Altus ExtremeFill (EFx) Module, Vector Extreme Pre-treatment Module (for plasma, ultra-violet or infra-red pre-treatment), and Vector or Vector Extreme modules. A SOLA module may be used for UV exposure. All of the tools are available from Lam Research, Fremont Calif. These modules may be attached to the same backbone as the flowable deposition module. Also, any of these modules may be on different backbones. A controller may be connected to any or all of the components of a tool; its placement and connectivity may vary based on the particular implementation.

In certain embodiments, a controller 922 is employed to control process conditions during deposition and/or pre or post-treatment. Further description of a controller is provided below.

Figure 10:
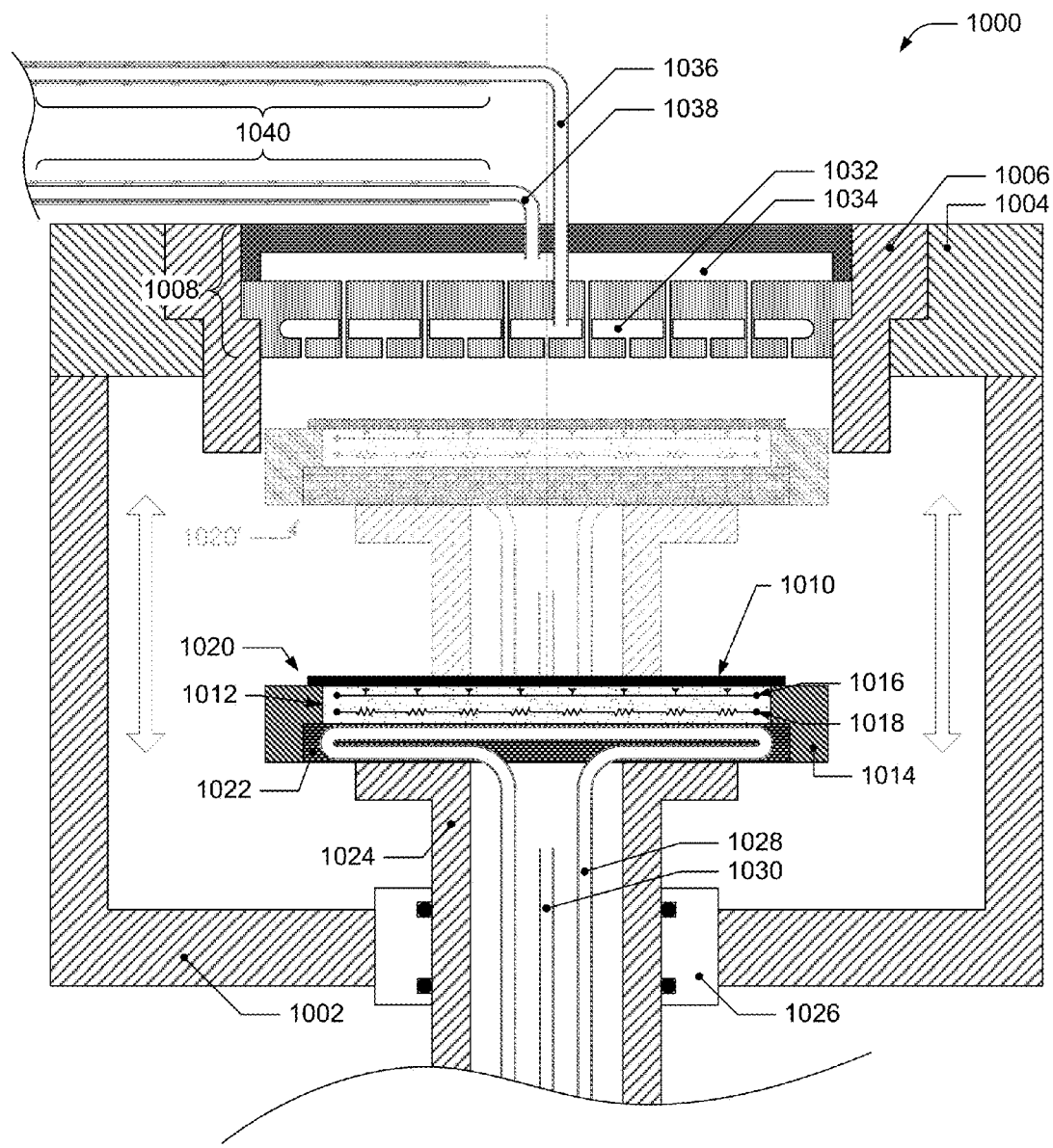

FIG. 10 shows an example of a deposition chamber for flowable dielectric deposition. A deposition chamber 1000 (also referred to as a reactor, or reactor chamber) includes chamber housing 1002, top plate 1004, skirt 1006, showerhead 1008, pedestal column 1024, and seal 1026 provide a sealed volume for flowable dielectric deposition. Wafer 1010 is supported by chuck 1012 and insulating ring 1014. Chuck 1012 includes RF electrode 1016 and resistive heater element 1018. Chuck 1012 and insulating ring 1014 are supported by pedestal 1020, which includes platen 1022 and pedestal column 1024. Pedestal column 1024 passes through seal 1026 to interface with a pedestal drive (not shown). Pedestal column 1024 includes platen coolant line 1028 and pedestal purge line 1030. Showerhead 1008 includes co-reactant-plenum 1032 and precursor-plenum 1034, which are fed by co-reactant-gas line 1036 and precursor-gas line 1038, respectively. Co-reactant-gas line 1036 and precursor-gas line 1038 may be heated prior to reaching showerhead 1008 in zone 1040. While a dual-flow plenum is described herein, a single-flow plenum may be used to direct gas into the chamber. For example, reactants may be supplied to the showerhead and may mix within a single plenum before introduction into the reactor. 1020' and 1020 refer to the pedestal, but in a lowered (1020) and raised (1020') position.

The chamber is equipped with, or connected to, gas delivery system for delivering reactants to reactor chamber 1000. A gas delivery system may supply chamber 1010 with one or more co-reactants, such as oxidants, including water, oxygen, ozone, peroxides, alcohols, etc. which may be supplied alone or mixed with an inert carrier gas. The gas delivery system may also supply chamber with one or more dielectric precursors, for example triethoxysilane (TES), which may be supplied alone or mixed with an inert carrier gas. The gas delivery system is also configured to deliver one or more treatment reagents, for plasma treatment as described herein reactor cleaning. For example, for plasma processing, hydrogen, argon, nitrogen, oxygen or other gas may be delivered.

Deposition chamber 1000 serves as a sealed environment within which flowable dielectric deposition may occur. In many embodiments, deposition chamber 1000 features a radially symmetric interior. Reducing or eliminating departures from a radially symmetric interior helps ensure that flow of the reactants occurs in a radially balanced manner over wafer 1010. Disturbances to the reactant flows caused by radial asymmetries may cause more or less deposition on some areas of wafer 1010 than on other areas, which may produce unwanted variations in wafer uniformity.

Deposition chamber 1000 includes several main components. Structurally, deposition chamber 1000 may include a chamber housing 1002 and a top plate 1004. Top plate 1004 is configured to attach to chamber housing 1002 and provide a seal interface between chamber housing 1002 and a gas distribution manifold/showerhead, electrode, or other module equipment. Different top plates 1004 may be used with the same chamber housing 1002 depending on the particular equipment needs of a process.

Chamber housing 1002 and top plate 1004 may be machined from an aluminum, such as 6061-T6, although other materials may also be used, including other grades of aluminum, aluminum oxide, and other, non-aluminum materials. The use of aluminum allows for easy machining and handling and makes available the elevated heat conduction properties of aluminum.

Top plate 1004 may be equipped with a resistive heating blanket to maintain top plate 1004 at a desired temperature. For example, top plate 1004 may be equipped with a resistive heating blanket configured to maintain top plate 1004 at a temperature of between −20° C. and 100° C. Alternative heating sources may be used in addition to or as an alternative to a resistive heating blanket, such as circulating heated liquid through top plate 1004 or supplying top plate 1004 with a resistive heater cartridge.

Chamber housing 1002 may be equipped with resistive heater cartridges configured to maintain chamber housing 1002 at a desired temperature. Other temperature control systems may also be used, such as circulating heated fluids through bores in the chamber walls.

The chamber interior walls may be temperature-controlled during flowable dielectric to a temperature between −20° C. and 100° C. In some implementations, top plate 1004 may not include heating elements and may instead rely on thermal conduction of heat from chamber resistive heater cartridges to maintain a desired temperature. Various embodiments may be configured to temperature-control the chamber interior walls and other surfaces on which deposition is undesired, such as the pedestal, skirt, and showerhead, to a temperature approximately 10° C. to 40° C. higher than the target deposition process temperature. In some implementations, these components may be held at temperatures above this range.

Through actively heating and maintaining deposition chamber 1000 temperature during processing, the interior reactor walls may be kept at an elevated temperature with respect to the temperature at which wafer 1010 is maintained. Elevating the interior reactor wall temperature with respect to the wafer temperature may minimize condensation of the reactants on the interior walls of deposition chamber 1000 during flowable film deposition. If condensation of the reactants occurs on the interior walls of deposition chamber 1000, the condensate may form a deposition layer on the interior walls, which is undesirable.

In addition to, or alternatively to, heating chamber housing 1002 and/or top plate 1004, a hydrophobic coating may be applied to some or all of the wetted surfaces of deposition chamber 1000 and other components with wetted surfaces, such as pedestal 1020, insulating ring 1014, or platen 1022, to prevent condensation. Such a hydrophobic coating may be resistant to process chemistry and processing temperature ranges, e.g., a processing temperature range of −20° C. to 100° C. Some silicone-based and fluorocarbon-based hydrophobic coatings, such as polyethylene, may not be compatible with an oxidizing, e.g., plasma, environment and may not be suitable for use. Nano-technology based coatings with super-hydrophobic properties may be used; such coatings may be ultra-thin and may also possess oleophobic properties in addition to hydrophobic properties, which may allow such a coating to prevent condensation as well as deposition of many reactants, used in flowable film deposition. One example of a suitable super-hydrophobic coating is titanium dioxide ($TiO_2$).

Various thermal breaks may separate various components of the chamber 1000. As used herein, a thermal break refers to a physical separation, i.e., gap, between parts which is sufficiently large enough to substantially prevent conductive heat transfer between the parts via any gases trapped within the thermal break yet which is also sufficiently small enough to prevent substantial convective heat transfer between the parts via the gases. Parts or portions of parts which are either in direct contact, or which are separated by a gap but which are still sufficiently close enough together to experience significant conductive heat transfer across the gap via any gases trapped within the gap, may be referred to as being in "thermal contact" with each other. Thermal breaks are described more fully in U.S. patent application Ser. No. 13/329,078, incorporated by reference herein.

Deposition chamber 1000 may also include one or more UV sources, which may be used for in situ UV exposure. This is discussed further below with respect to FIG. 12.

Figure 11A:
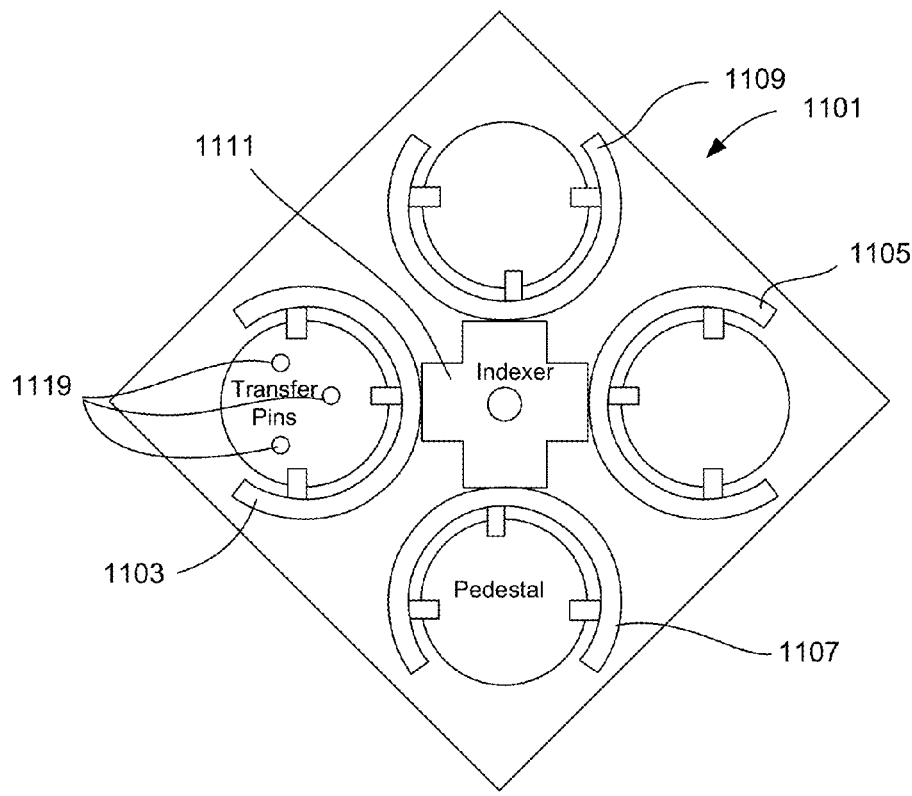
Figure 11B:
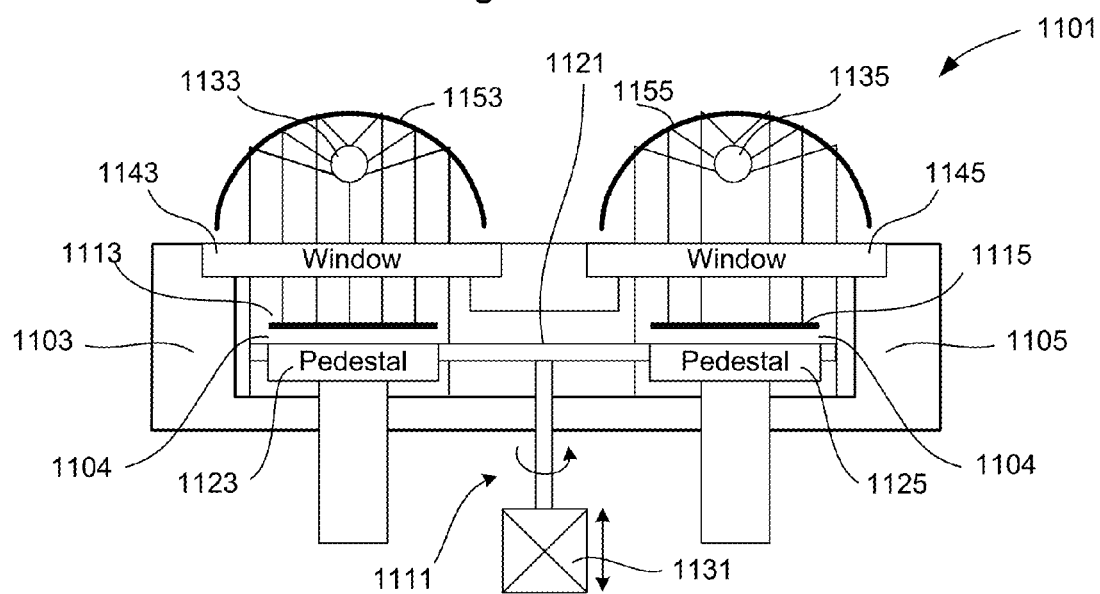

FIGS. 11A and 11B show an example of a UV chamber for UV exposure of flowable dielectric material. Chamber 1101 includes multiple stations 1103, 1105, 1107 and 1109, each of which can accommodate a substrate. Station 1103 includes transfer pins 1119. FIG. 11B is a side view of the chamber showing stations 1103 and 1105 and substrates 1113 and 1115 located above pedestals 1123 and 1125. There are gaps 1104 between the substrates and the pedestals. A substrate may be supported above a pedestal by an attachment, such as a pin, or floated on gas. Parabolic or planar cold mirrors 1153 and 1155 are located above UV flood lamp sets 1133 and 1135. UV light from lamp sets 1133 and 1135 passes through windows 1143 and 1145. Substrates 1103 and 1105 are then exposed to the radiation. In alternative embodiments, a substrate may be supported by the pedestals 1123 and 1125. The lamps may or may not be equipped with cold mirrors. In some embodiments, the substrate temperature may be maintained by use of a conductive gas such as helium or a mixture of helium and argon at a sufficiently high pressure, typically between 50 and 760 Torr.

In operation, a substrate may be sequentially exposed to each UV light source, with multiple substrates exposed to a UV light source in parallel. Alternatively, each substrate may be exposed to only one or subset of the UV light sources.

In some cases, different stations irradiate the wafer at different wavelengths or wavelengths ranges. The example above uses a UV flood lamp, which generates radiation in a broad spectrum. Optical components may be used in the radiation source to modulate the part of the broad spectrum that reaches the wafer. For example, reflectors, filters, or combination of both reflectors and filters may be used to subtract a part of the spectrum from the radiation. One such filter is a bandpass filter.

Optical bandpass filters are designed to transmit a specific waveband. They are composed of many thin layers of dielectric materials, which have differing refractive indices to produce constructive and destructive interference in the transmitted light. In this way optical bandpass filters can be designed to transmit a specific waveband only. The range limitations are usually dependent upon the interference filters lens, and the composition of the thin-film filter material. Incident light is passed through two coated reflecting surfaces. The distance between the reflective coatings determines which wavelengths will destructively interfere and which wavelengths will be allowed to pass through the coated surfaces. In situations where the reflected beams are in phase, the light will pass through the two reflective surfaces. However, if the wavelengths are out of phase, destructive interference will block most of the reflections, allowing almost nothing to transmit through. In this way, interference filters are able to attenuate the intensity of transmitted light at wavelengths that are higher or lower than the desired range.

Another filter that can attenuate the wavelengths of the radiation reaching the wafer is the window 343, typically made of quartz. By changing the level of metal impurities and water content, the quartz window can be made to block radiations of undesired wavelengths. High-purity Silica Quartz with very little metal impurity is more transparent deeper into the ultraviolet. As an example, quartz with a thickness of 1 cm will have a transmittance of about 50% at a wavelength of 170 nm, which drops to only a few percent at 160 nm. Increasing levels of impurities in the quartz cause transmission of UV at lower wavelengths to be reduced. Electrically fused quartz has a greater presence of metallic impurities, limiting its UV transmittance wavelength to around 200 nm. Synthetic silica, on the other hand, has much greater purity and will transfer down to 170 nm. For infrared radiation, the transmittance through quartz is determined by the water content. More water in the quartz means that infrared radiation is more likely absorbed. The water content in the quartz may be controlled through the manufacturing process. Thus, the spectrum of radiation transmission through the quartz window may be controlled to cutoff or reduce UV transmission at shorter wavelengths and/or to reduce infrared transmission at longer wavelengths.

Another type of filter is UV cut-off filters. These filters do not allow UV transmission below a set value, e.g. 280 nm. These filters work by absorbing wavelengths below the cut-off value. This may be helpful to optimize the desired cure effect.

Radiation wavelength can also be controlled by modifying the properties of the light generator. UV flood lamps can generate a broad spectrum of radiation, from UV to infrared, but other light generators may be used to emit a smaller spectrum or to increase the intensity of a narrower spectrum. Other light generators may be mercury-vapor lamps, doped mercury-vapor lamps, electrode lamps, excimer lamps, excimer lasers, pulsed Xenon lamps, doped Xenon lamps. Lasers such as excimer lasers can emit radiation of a single wavelength. When dopants are added to mercury-vapor and to Xenon lamps, radiation in a narrow wavelength band may be made more intense. Common dopants are iron, nickel, cobalt, tin, zinc, indium, gallium, thallium, antimony, bismuth, or combinations of these. For example, mercury vapor lamps doped with indium emits strongly in the visible spectrum and around 450 nm; iron, at 360 nm; and gallium, at 320 nm. Radiation wavelengths can also be controlled by changing the fill pressure of the lamps. For example, high-pressure mercury vapor lamps can be made to emit wavelengths of 250 to 440 nm, particularly 310 to 350 nm more intensely. Low-pressure mercury vapor lamps emit at shorter wavelengths.

In addition to changing light generator properties and the use of filters, reflectors that preferentially deliver one or more segments of the lamps spectral output may be used. A common reflector is a cold mirror that allows infrared radiation to pass but reflects other light. Other reflectors that preferentially reflect light of a spectral band may be used. Therefore a wafer may be exposed to radiation of different wavelengths at different stations. Of course, the radiation wavelengths may be the same in some stations.

In FIG. 11B, pedestals 1123 and 1125 are stationary. Indexer 1111 lifts and moves each substrate from one pedestal to another between each exposure period. Indexer 1111 is an indexer plate 1121 attached to a motion mechanism 1131 that has rotational and axial motion. Upward axial motion is imparted to indexer plate 1121 to pick up substrates from each pedestal. The rotational motion serves to advance the substrates from one station to another. The motion mechanism then imparts downward axial motion to the plate to put the substrates down on the stations.

Pedestals 1123 and 1125 may be electrically heated and maintained at a desired process temperature. As noted above, the substrate temperature is maintained at below the boiling point of the dielectric precursors in some embodiments. As such, pedestals 1123 and 1125 may also be equipped with cooling lines. Each pedestal may have its own heating or cooling system. In an alternate embodiment, a large heater block may be used to support the wafers instead of individual pedestals. A thermally conductive gas, such as helium, is used to cause good thermal coupling between the pedestal and the wafer. In some embodiments, cast pedestals with coaxial heat exchangers may be used. These are described in U.S. Pat. No. 7,327,948, incorporated by reference herein.

FIGS. 11A and 11B show only an example of a suitable apparatus and other apparatuses may be used. For example, in another embodiment that uses flood lamps, the substrate support may be a carousel. Unlike with the stationary pedestal substrate supports, the substrates do not move relative to the carousel. After a substrate is loaded onto the carousel, the carousel rotates, if necessary, to expose the wafer to light from a UV lamp set. The carousel is stationary during the exposure period. After the exposure period, the carousel may be rotated advance each substrate for exposure to the next set of lamps. Heating and cooling elements may be embedded within the rotating carousel. Alternatively the carousel may be in contact with a heat transfer plate or hold the substrates so that they are suspended above a heat transfer plate.

In certain embodiments, the substrates are exposed to UV radiation from focused, rather than, flood lamps. Unlike the flood lamp embodiments wherein the substrates are stationary during exposure (as in FIGS. 11A and 11B), there is relative movement between the wafers and the light sources during exposure to the focused lights as the substrates are scanned.

FIGS. 11A and 11B show an example of multi-station UV exposure tool that may be connected under vacuum to a flowable dielectric deposition tool to permit transfer between a flowable dielectric deposition tool and UV exposure tool under controlled pressure and temperature. An example of a multi-station UV exposure tool is the SOLA tool available from Lam Research of Fremont, Calif. Single station UV exposure tools may be employed.

In certain embodiments, a multi-station tool may be employed in which dielectric deposition occurs at a first station or subset of stations and UV exposure at a second station or subset of stations. A schematic example of such an apparatus is provided in FIG. 12A, which a multi-station chamber 1200 including a deposition station 1202 configured for cold condensation of a dielectric precursor or product thereof and UV station 1204 configured for UV exposure. One or more deposition stations 1202 may be configured as in the example of FIG. 10. One or more UV exposure stations 1204 may be configured as station 1103 in the example of FIG. 11B.

Figure 12A:
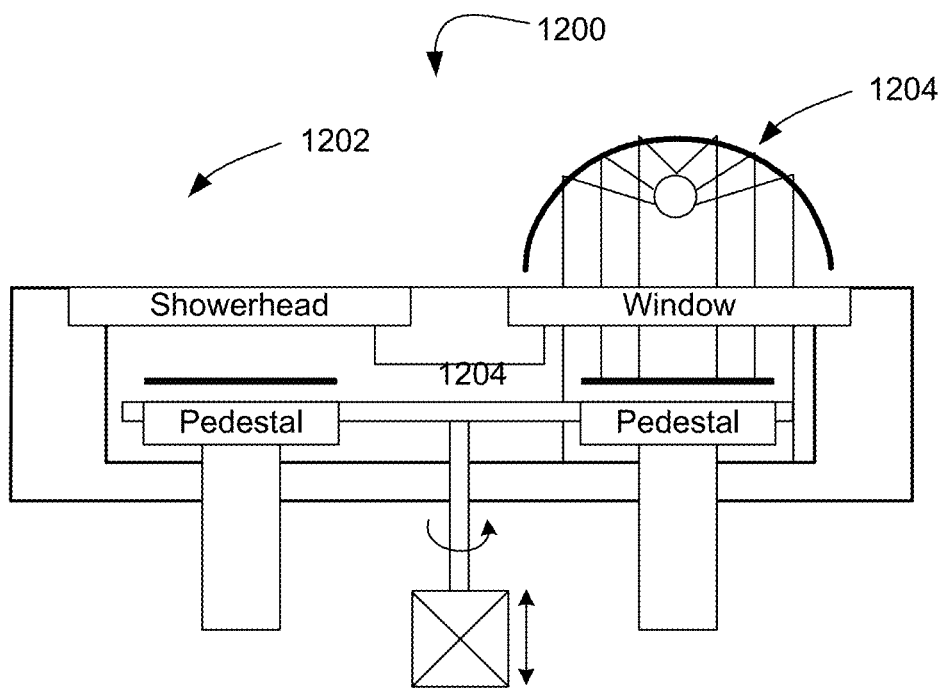
Figure 12B:
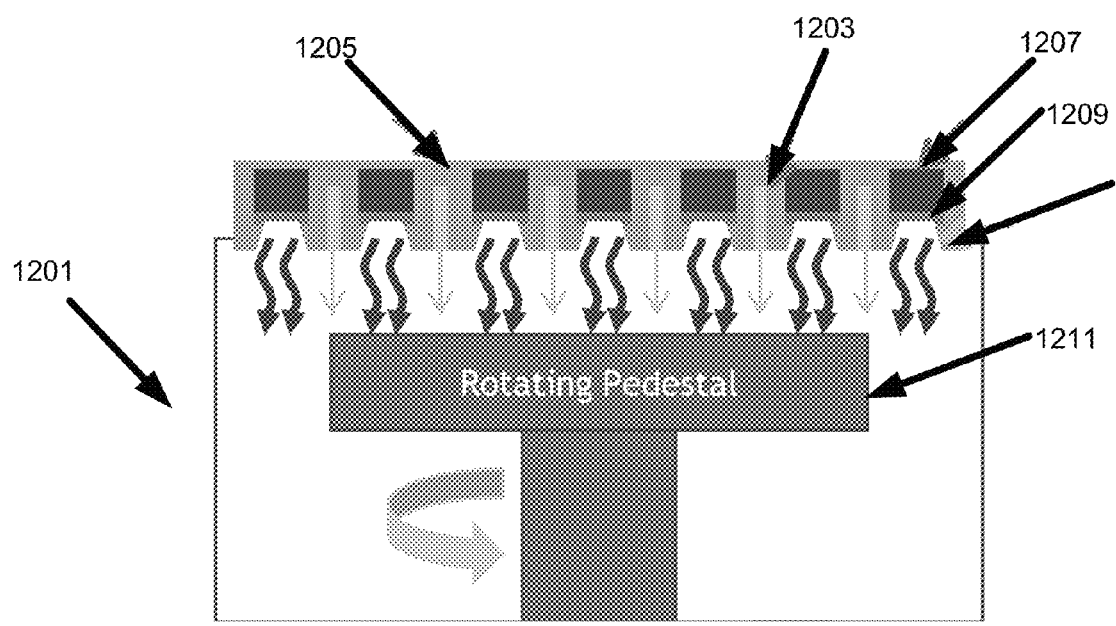

One or more of the apparatuses depicted in FIGS. 9-12A may be used in to perform ex-situ UV exposure as discussed above with respect to FIG. 4A. To perform in-situ UV exposure, a UV exposure tool as shown in FIGS. 11A and 11B may be employed, with deposition gases inlet to the chamber, e.g., through side or top gas inlets. In alternate embodiments, a deposition chamber such as that shown in FIG. 10 may be equipped with one or more UV sources. A schematic example of such a chamber is shown in FIG. 12B. Chamber 1201 includes a showerhead 1203; similar to showerhead 1008 in the example of FIG. 10, showerhead 1203 has one or more plenums 1205 for introducing reactant gases to form a flowable film. Further, UV sources 1207 are embedded within or mounted on the showerhead to provide UV radiation. Each UV source 1207 may be separated from the interior of the chamber 1201 by a window 1209. Examples of windows are described above with reference to FIGS. 11A and 11B. The showerhead 1203 may be designed such that the UV sources 1207 and gas openings are in a regular pattern such that gas delivery and UV irradiation are fairly uniform across a substrate in the chamber. For example, the UV sources and/or the showerhead holes may be in a hexagonal pattern. FIG. 12 also shows a purge gas 1211, e.g., Ar, that may be employed to keep the windows 1209 clean. A pedestal 1213 is configured to support a substrate. In some embodiments, the pedestal 1213, or a support thereon, is rotatable such that a substrate can be rotated if necessary during deposition to promote deposition and UV exposure uniformity.

As indicated above with respect to FIG. 9, in certain embodiments, a controller 922 is employed to control process conditions during deposition and/or pre or post-treatment. Such a controller may be used to control operations in any of the apparatuses depicted in FIGS. 9-12B.

The controller 922 will typically include one or more memory devices and one or more processors. The processor may include a CPU or computer, analog and/or digital input/output connections, stepper motor controller boards, etc. Typically there will be a user interface associated with controller 922. The user interface may include a display screen, graphical software displays of the apparatus and/or process conditions, and user input devices such as pointing devices, keyboards, touch screens, microphones, etc.

In certain embodiments, the controller 922 may also control all of the activities during the process, including gas flow rate, chamber pressure, generator process parameters. The controller 922 executes system control software including sets of instructions for controlling the timing, mixture of gases, chamber pressure, pedestal (and substrate) temperature, UV power, and other parameters of a particular process. The controller 922 may also control concentration of various process gases in the chamber by regulating valves, liquid delivery controllers and MFCs in the delivery system as well as flow restriction valves and the exhaust line. The controller 922 executes system control software including sets of instructions for controlling the timing, flow rates of gases and liquids, chamber pressure, substrate temperature, UV power, and other parameters of a particular process. Other computer programs stored on memory devices associated with the controller may be employed in some embodiments. In certain embodiments, the controller 922 controls the transfer of a substrate into and out of various components of the apparatuses.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code and pressure control code.

In some implementations, the controller 922 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 922, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, UV power and duty cycle settings, positional and operation settings, wafer transfers into and out of a tool and other transfer tools and/or load locks connected to or interfaced with a specific system.

Broadly speaking, the controller 922 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 922 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 922, in some implementations, may be a part of or coupled to a computer that is integrated with, coupled to the system, otherwise networked to the system, or a combination thereof. For example, the controller 922 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 922 receives instructions in the form of data, which specify parameters for each of the processing steps to be performed during one or more operations. It should be understood that the parameters may be specific to the type of process to be performed and the type of tool that the controller 922 is configured to interface with or control. Thus as described above, the controller 922 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, a UV exposure chamber or module, and any other semiconductor processing systems that may be associated or used in the fabrication and/or manufacturing of semiconductor wafers.

As noted above, depending on the process step or steps to be performed by the tool, the controller 922 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller parameters relate to process conditions such as, for example, timing of each operation, pressure inside the chamber, substrate temperature, and process gas flow rates. These parameters are provided to the user in the form of a recipe, and may be entered utilizing the user interface. Signals for monitoring the process may be provided by analog and/or digital input connections of the controller 922. The signals for controlling the process are output on the analog and digital output connections of the apparatus.

The disclosed methods and apparatuses may also be implemented in systems including lithography and/or patterning hardware for semiconductor fabrication. Further, the disclosed methods may be implemented in a process with lithography and/or patterning processes preceding or following the disclosed methods. The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or includes together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

The invention claimed is:

1. A process for forming a dielectric film,
introducing a vapor phase cyclical silicon precursor to a chamber housing a substrate;
condensing the vapor phase cyclical silicon precursor to form a flowable dielectric film to fill a gap on the substrate; and while the gap is being filled with the flowable dielectric film, exposing the flowable dielectric film in the gap to ultraviolet radiation to polymerize the condensed cyclical silicon precursor and form a solid dielectric film, wherein a substrate temperature is maintained at a temperature less than the boiling point of the cyclical silicon precursor during the exposure.

2. The process of claim 1, wherein the condensation and polymerization is uncatalyzed.

3. The process of claim 1, wherein the cyclical silicon precursor is a cyclic silazane or cyclic siloxane.

4. The process of claim 1, wherein the cyclical silicon precursor is octamethylcyclotetrasiloxane, tetravinyltetramethylcyclotetrasiloxane, tetramethylcyclotetrasiloxane, pentamethylcyclopentasiloxane, or hexamethylcyclotrisiloxane.

5. The process of claim 1, wherein the cyclical silicon precursor has a boiling point of at least 125° C.

6. The process of claim 1, wherein the vapor phase cyclical silicon precursor is introduced without a co-reactant.

7. The process of claim 1, wherein the partial pressure of the cyclical silicon precursor is below the saturation pressure of the cyclical silicon precursor.

8. The process of claim 1, wherein the flowable dielectric films seals pores of a porous dielectric material on the substrate.

9. The process of claim 1, wherein a solid dielectric film having no cracking and a thickness of greater than 1 micron is formed.

10. The process of claim 1, wherein the substrate temperature is maintained between about −20° C. and 100° C.

11. The process of claim 1, wherein the polymerization proceeds by a radical-chain mechanism.

12. The process of claim 1, wherein the polymerization comprises photo dissociation of water.

13. The process of claim 1, wherein the flowable dielectric film is exposed to the ultraviolet radiation in the chamber.

14. The process of claim 13, wherein the flowable dielectric film is exposed to the ultraviolet radiation in a same station of the chamber as the formation of the flowable dielectric film occurs.

15. The process of claim 13, further comprising transferring the substrate to a different station in the chamber for ultraviolet exposure after condensing the cyclical silicon precursor or a reaction product thereof on the substrate.

16. The process of claim 1, comprising transferring the substrate to a different chamber for ultraviolet exposure after condensing the cyclical silicon precursor or a reaction product thereof on the substrate.

17. A process for forming a dielectric film,
introducing a vapor phase cyclical silicon precursor to a chamber housing a substrate;
condensing the vapor phase cyclical silicon precursor to form a flowable dielectric film on the substrate; and
comprising exposing the substrate with ultraviolet radiation while condensing the vapor phase cyclical silicon precursor on the substrate to polymerize the condensed cyclical silicon precursor and form a solid dielectric film, wherein a substrate temperature is maintained at a temperature less than the boiling point of the cyclical silicon precursor during the exposure.

* * * * *